(12) United States Patent
Ohara

(10) Patent No.: US 9,129,575 B2
(45) Date of Patent: Sep. 8, 2015

(54) LIQUID CRYSTAL DISPLAY DEVICE

(75) Inventor: Masanori Ohara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 145 days.

(21) Appl. No.: 14/110,974

(22) PCT Filed: Apr. 20, 2012

(86) PCT No.: PCT/JP2012/060678
§ 371 (c)(1),
(2), (4) Date: Oct. 10, 2013

(87) PCT Pub. No.: WO2012/147637
PCT Pub. Date: Nov. 1, 2012

(65) Prior Publication Data
US 2014/0055329 A1    Feb. 27, 2014

(30) Foreign Application Priority Data
Apr. 28, 2011    (JP) .................. 2011-101759

(51) Int. Cl.
*G09G 3/36* (2006.01)
*G11C 19/28* (2006.01)

(52) U.S. Cl.
CPC ............ *G09G 3/3674* (2013.01); *G09G 3/3666* (2013.01); *G09G 3/3677* (2013.01); *G11C 19/28* (2013.01)

(58) Field of Classification Search
CPC .......... G09G 3/3677; G09G 2320/028; G09G 3/3655; G09G 2300/0447; G09G 3/3674; G09G 2300/0408; G09G 2310/0286
USPC ...................................... 345/87, 98, 99, 100
See application file for complete search history.

(56) References Cited

U.S. PATENT DOCUMENTS

| 2003/0227429 A1 | 12/2003 | Shimoshikiryo |
| 2007/0070008 A1 | 3/2007 | Shin et al. |
| 2010/0328198 A1* | 12/2010 | Tsubata ..................... 345/87 |

FOREIGN PATENT DOCUMENTS

| JP | 2004-062146 A | 2/2004 |
| JP | 2007-086791 A | 4/2007 |
| JP | 2008-145886 A | 6/2008 |

OTHER PUBLICATIONS

Official Communication issued in International Patent Application No. PCT/JP2012/060678, mailed on Jul. 17, 2012.
Lee et al., "55.3: Driving Method of Integrated Gate Driver for Large Area LCD-TV", SID 08 Digest, 2008, pp. 838-841.

* cited by examiner

Primary Examiner — Koosha Sharifi-Tafreshi
(74) Attorney, Agent, or Firm — Keating & Bennett, LLP

(57) ABSTRACT

In a liquid crystal display device having a configuration in which one pixel is divided into a plurality of sub-pixels to improve the view angle characteristic, the number of IC chips for driving a panel is reduced more than that in the conventional technique. A gate driver is provided with a first shift register (20A) corresponding to first gate bus lines (GLAi) (i=1 to n), a second shift register (20B) corresponding to second gate bus lines (GLBi), and AND operation circuits (ANDi) each outputting a signal indicating AND between an output signal (QAi) from the first shift register (20A) and an output signal (QBi) from the second shift register (20B). To the first gate bus line (GLAi), the output signal (QAi) from the first shift register (20A) is applied as it is as a scanning signal (GAi). To the second gate bus line (GLBi), an output signal from the AND operation circuit (ANDi) is applied as a scanning signal (GBi).

6 Claims, 15 Drawing Sheets

|  | THE NUMBER OF GATE DRIVER IC CHIPS | THE NUMBER OF SOURCE DRIVER IC CHIPS |
|---|---|---|
| CONVENTIONAL 2G-1D CONFIGURATION | 2 p | q |
| CONVENTIONAL 1G-2D CONFIGURATION | p OR 0 | 2 q |
| EMBODIMENT | 0 | q |

LIQUID CRYSTAL DISPLAY DEVICE

TECHNICAL FIELD

The present invention relates to a liquid crystal display device and, more particularly, relates to a liquid crystal display device having a configuration in which one pixel is divided into a plurality of sub-pixels in order to improve the view angle characteristic.

BACKGROUND ART

As one of methods of driving a liquid crystal display device, conventionally, there is a known method of "constructing one pixel by a plurality of (typically, two) sub-pixels and driving liquid crystal such that brightness of the plurality of sub-pixels varies one another) (hereinafter, referred to as a "pixel dividing method"). The pixel dividing method is employed to improve the view angle characteristic of a liquid crystal display device. It should be noted that, in the following, a region for forming one pixel (in the case of a liquid crystal display device performing color display by pixels of three colors of R, G, and B, a pixel of each of the colors) will be referred to as a "pixel portion", and a region forming a sub-pixel will be referred to as a "sub-pixel portion".

In a liquid crystal display device employing the pixel dividing method, the potential of a pixel electrode when a pixel capacitance is charged (hereinafter, referred to as "charging potential") is set to be different in two sub-pixel portions. As configurations realizing it, a configuration that two gate bus lines GL1 and GL2 and one source bus line SL are assigned to one pixel portion 9 as illustrated in FIG. 17 (hereinafter, referred to as "2G-1D configuration"), a configuration that one gate bus line GL and two source bus lines SL1 and SL2 are assigned to one pixel portion 9 as illustrated in FIG. 18 (hereinafter, referred to as "1G-2D configuration"), and the like are known.

In a liquid crystal display device employing the 2G-1D configuration (refer to FIG. 17), by making the waveform of a scanning signal supplied to the gate bus line GL1 provided in correspondence with one of the sub pixel portions and that of a scanning signal supplied to the gate bus line GL2 provided in correspondence with the other sub pixel portion different from each other, the difference between the charging potentials is obtained between the two sub-pixel portions. In the configuration, the gate driver for driving the gate bus line is realized by providing, typically, one or a plurality of IC chips on both sides of a display unit (one end side and the other end side in a direction in which the gate bus line extends). The source driver for driving the source bus line is realized by providing, typically, one or a plurality of IC chips on one end side of the display unit (one end side in a direction in which the source bus line extends).

In a liquid crystal display device employing the 1G-2D configuration (refer to FIG. 18), by making the waveform of a video signal supplied to the source bus line SL1 provided in correspondence with one of the sub-pixel portions and that of a video signal supplied to the source bus line SL2 provided in correspondence with the other sub-pixel portion different from each other, the difference between the charging potentials is obtained between the two sub-pixel portions. In the configuration, the gate driver is typically realized by providing one or a plurality of IC chips on one end side of a display unit (one end side in a direction in which the gate bus line extends) or by being monolithically formed on a glass substrate on one end side of the display unit. The source driver is typically realized by providing one or a plurality of IC chips on both sides of the display unit (one end side and the other end side in a direction in which the source bus line extends).

It should be noted that configuration examples of a liquid crystal display device employing the pixel dividing method are disclosed in, for example, Japanese patent application laid-open No. 2004-62146, Japanese patent application laid-open No. 2008-145886, Japanese patent application laid-open No. 2007-86791, "55.3: Driving Method of Integrated Gate Driver for Large Area LCD-Tv" of SID 08 Digest", and the like.

PRIOR ART DOCUMENTS

Patent Documents

[Patent Document 1] Japanese Patent Application Laid-Open No. 2004-62146
[Patent Document 2] Japanese Patent Application Laid-Open No. 2008-145886
[Patent Document 3] Japanese Patent Application Laid-Open No. 2007-86791

Non-Patent Document

[Non-Patent Document 1] Min-Cheol Lee, Yong-Soon Lee, Seung-Hwan Moon, Dong-Gyu Kim, Kyung-Seob Kim, Nam Deog Kim, and Sang Soo Kim, "55.3: Driving Method of Integrated Gate Driver for Large Area LCD-TV", SID 08 Digest, p. 838-841, 2008.

SUMMARY OF THE INVENTION

Problems to be Solved by the Invention

In a liquid crystal display device employing the 2G-1D configuration, since the gate bus line GL1 provided in correspondence with one of sub-pixel portions and the gate bus line GL2 provided in correspondence with the other sub-pixel portion have to be driven, gate driver IC chips having the number which is twice as many as that in a general liquid crystal display device (a liquid crystal display device which does not employ the pixel dividing method) are necessary. In a liquid crystal display device employing the 1G-2D configuration, since the source bus line SL1 provided in correspondence with one of sub-pixel portions and the source bus line SL2 provided in correspondence with the other sub-pixel portion have to be driven, source driver IC chips having the number which is twice as many as that in a general liquid crystal display device are necessary. As described above, in a conventional liquid crystal display device employing the pixel dividing method, since IC chips for driving a panel of the number larger than that in a general liquid crystal display device are required, the cost is high.

Therefore, an object of the present invention is to reduce the number of IC chips for driving a panel to be smaller than that in a conventional technique in a liquid crystal display device having a configuration in which one pixel is divided into a plurality of sub-pixels to improve the view angle characteristic.

Means for Solving the Problems

A first aspect of the present invention is directed to a liquid crystal display device comprising:
  a pixel portion which has a first sub-pixel portion including
    a first switching element, a first pixel electrode connected to a first conduction terminal of the first switching element, and a first pixel capacitance accumulating charges in accordance with potential of the first pixel electrode, and a second sub-pixel portion including a second switching element, a second pixel electrode connected to a first conduction terminal of the second switching element, and a second pixel capacitance accumulating charges in accordance with potential of the second pixel electrode, and forms a pixel matrix of n rows×m columns (n and m are natural numbers) in a display unit for displaying an image;

a first scanning signal line provided in correspondence with each of the rows in the pixel matrix and connected to a control terminal of the first switching element;

a second scanning signal line provided in correspondence with each of the rows of the pixel matrix and connected to a control terminal of the second switching element;

a video signal line provided in correspondence with each of the columns of the pixel matrix and connected to a second conduction terminal of the first switching element and a second conduction terminal of the second switching element;

a scanning signal line drive circuit for driving the first scanning signal line and the second scanning signal line; and a video signal line drive circuit for driving the video signal line, wherein the scanning signal line drive circuit includes:
  a first shift register constructed by a plurality of first output signal generating stages corresponding to the first scanning signal line and outputting a first output signal sequentially becoming an on level stage by stage from the plurality of first output signal generating stages in accordance with a first clock signal group as two-phase clock signals which are deviated from each other by 180 degrees;
  a second shift register constructed by a plurality of second output signal generating stages corresponding to the second scanning signal line and outputting a second output signal sequentially becoming an on level stage by stage from the plurality of second output signal generating stages in accordance with a second clock signal group as two-phase clock signals which are deviated from each other by 180 degrees; and
  an AND operation unit performing an AND operation using the first output signal and the second output signal and outputting a third output signal indicative of an operation result, the display unit and the scanning signal line drive circuit are monolithically formed on a single substrate, and the first output signal is applied as a scanning signal to the first scanning signal line and the third output signal is applied as a scanning signal to the second scanning signal line, or the third output signal is applied as a scanning signal to the first scanning signal line and the second output signal is applied as a scanning signal to the second scanning signal line.

According to a second aspect of the present invention, in the first aspect of the present invention,
  the AND operation unit is an AND operation circuit for obtaining AND between the first output signal and the second output signal.

According to a third aspect of the present invention, in the second aspect of the present invention,
  when a clock signal which is input to control output of the first output signal out of the two-phase clock signals constructing the first clock signal group upon paying attention to each of the first output signal generating stages and a clock signal which is input to control output of the second output signal out of the two-phase clock signals constructing the second clock signal group upon paying attention to each of the second output signal generating stages are defined as stage output control clocks, in the first output signal generating stage and the second output signal generating stage as a pair of stages corresponding to any row, the phase of the stage output control clock which is input to the second output signal generating stage is delayed from the phase of the stage output control clock which is input to the first output signal generating stage by a range of zero degree to 180 degrees.

According to a fourth aspect of the present invention, in the third aspect of the present invention,
  in the first output signal generating stage and the second output signal generating stage as the pair of stages corresponding to any row, the phase of the stage output control clock which is input to the second output signal generating stage is delayed from the phase of the stage output control clock which is input to the first output signal generating stage by 90 degrees.

According to a fifth aspect of the present invention, in the first aspect of the present invention,
  the first output signal generating stage, the second output signal generating stage, and the AND operation unit are constructed by using thin film transistors of either an N-channel type or a P-channel type.

According to a sixth aspect of the present invention, in the fifth aspect of the present invention,
  when a clock signal which is input to control output of the first output signal out of the two-phase clock signals constructing the first clock signal group upon paying attention to each of the first output signal generating stages and a clock signal which is input to control output of the second output signal out of the two-phase clock signals constructing the second clock signal group upon paying attention to each of the second output signal generating stages are defined as stage output control clocks, each of the first output signal generating stage and the second output signal generating stage comprises:
  an output node;
  an output control switching element having a first conduction terminal to which the stage output control clock is supplied and a second conduction terminal connected to the output node;
  a first node connected to a control terminal of the output control switching element;
  a first node turning on switching element having a second conduction terminal connected to the first node, and a control terminal and a first conduction terminal to which a signal output from the output node of a preceding stage is supplied; and
  an output node turning off switching element having a first conduction terminal connected to the output node, a second conduction terminal to which a potential of an off level is supplied, and a control terminal to which a signal output from the output node in the following stage is supplied, the first output signal is output from the output node of the first output signal generating stage, and
  the second output signal is output from the output node of the second output signal generating stage.

Effects of the Invention

According to the first aspect of the present invention, in a liquid crystal display device employing the pixel dividing method, a display unit and a scanning signal line drive circuit are formed monolithically on a single substrate. The scanning signal line drive circuit includes: a first shift register for driving a first scanning signal line provided in correspondence with a first sub-pixel portion, a second shift register for driving a second scanning signal line provided in correspondence with a second sub-pixel portion, and an AND operation unit for outputting a third output signal indicative of a result of AND operation using a first output signal as a signal output from the first shift register and a second output signal as a signal output from the second shift register. The third output signal is applied, as a scanning signal, to the first scanning signal line or the second scanning signal line. In such a configuration, by making the phase of a clock signal controlling the operation of the first shift register and the phase of a clock signal controlling the operation of the second shift register deviated from each other, a period in which the scanning signal at the on level is applied to the first scanning signal line and a period in which the scanning signal at the on level is applied to the second scanning signal line can be set to different lengths. That is, in each of the rows of the pixel matrix, the charging period in the first sub-pixel portion and the charging period in the second sub-pixel portion can be set to different lengths. Consequently, in the liquid crystal display device having the configuration in which the scanning signal line drive circuit is monolithically formed, the charging potential in the first sub-pixel portion and the charging potential in the second sub-pixel portion can be made different from each other. By the above, the liquid crystal display device employing the pixel dividing method can be realized without providing an IC chip for driving the scanning signal line. Consequently, the cost of the liquid crystal display device employing the pixel dividing method can be reduced.

According to the second aspect of the invention, by making the phase of a clock signal controlling the operation of the first shift register and the phase of a clock signal controlling the operation of the second shift register deviated from each other, the length of a charging period in a sub-pixel portion (one of the first sub-pixel portion and the second sub-pixel portion) corresponding to a line (one of the first scanning signal line and the second scanning signal line) to which the third output signal is applied as the scanning signal becomes shorter than the length of the charging period in the sub-pixel portion (the other one of the first sub-pixel portion and the second sub-pixel portion) corresponding to the line (the other one of the first scanning signal line and the second scanning signal line) to which the signal output from the shift register is applied as it is as the scanning signal. Therefore, the charging potential in the first sub-pixel portion and the charging potential in the second sub-pixel portion can be set to different volumes. By the above, in a manner similar to the first aspect of the present invention, a liquid crystal display device employing the pixel dividing method can be realized without having an IC chip for driving a scanning signal line, and the cost of the liquid crystal display device employing the pixel dividing method can be reduced.

According to the third aspect of the present invention, the length of the charging period in a sub-pixel portion corresponding to a line to which the third output signal is applied as the scanning signal becomes reliably shorter than the length of the charging period in a sub-pixel portion corresponding to a line to which a signal output from the shift register is applied as it is as the scanning signal. Therefore, while reliably maintaining the effect of improvement in the view angle characteristic, the cost of the liquid crystal display device employing the pixel dividing method can be reduced.

According to the fourth aspect of the present invention, the length of the charging period in the sub-pixel portion corresponding to a line to which the third output signal is applied as the scanning signal becomes the half of the length of the charging period in the sub-pixel portion corresponding to a line to which a signal output from the shift register is applied as it is as the scanning signal. Consequently, in a manner similar to the third aspect of the invention, while reliably maintaining the effect of improvement in the view angle characteristic, the cost of the liquid crystal display device employing the pixel dividing method is reduced.

According to the fifth aspect of the present invention, thin film transistors of either the N-channel type or the P-channel type are used. Therefore, an effect similar to that of the first aspect of the invention is obtained without complicating the manufacturing process.

According to the sixth aspect of the present invention, each of stages (a first output signal generating stage and a second output signal generating stage) constructing the first shift register and the second shift register is provided with the minimum numbers of switching elements. Consequently, the cost of the liquid crystal display device employing the pixel dividing method can be reduced more effectively.

MODES FOR CARRYING OUT THE INVENTION

Hereinafter, with reference to the attached drawings, an embodiment of the present invention will be described. It should be noted that, in the following description, a gate terminal (a gate electrode) of a thin film transistor corresponds to a control terminal, a drain terminal (a drain electrode) corresponds to a first conduction terminal, and a source terminal (a source electrode) corresponds to a second conduction terminal.

<1. General Configuration and Operation>

Figure 2:
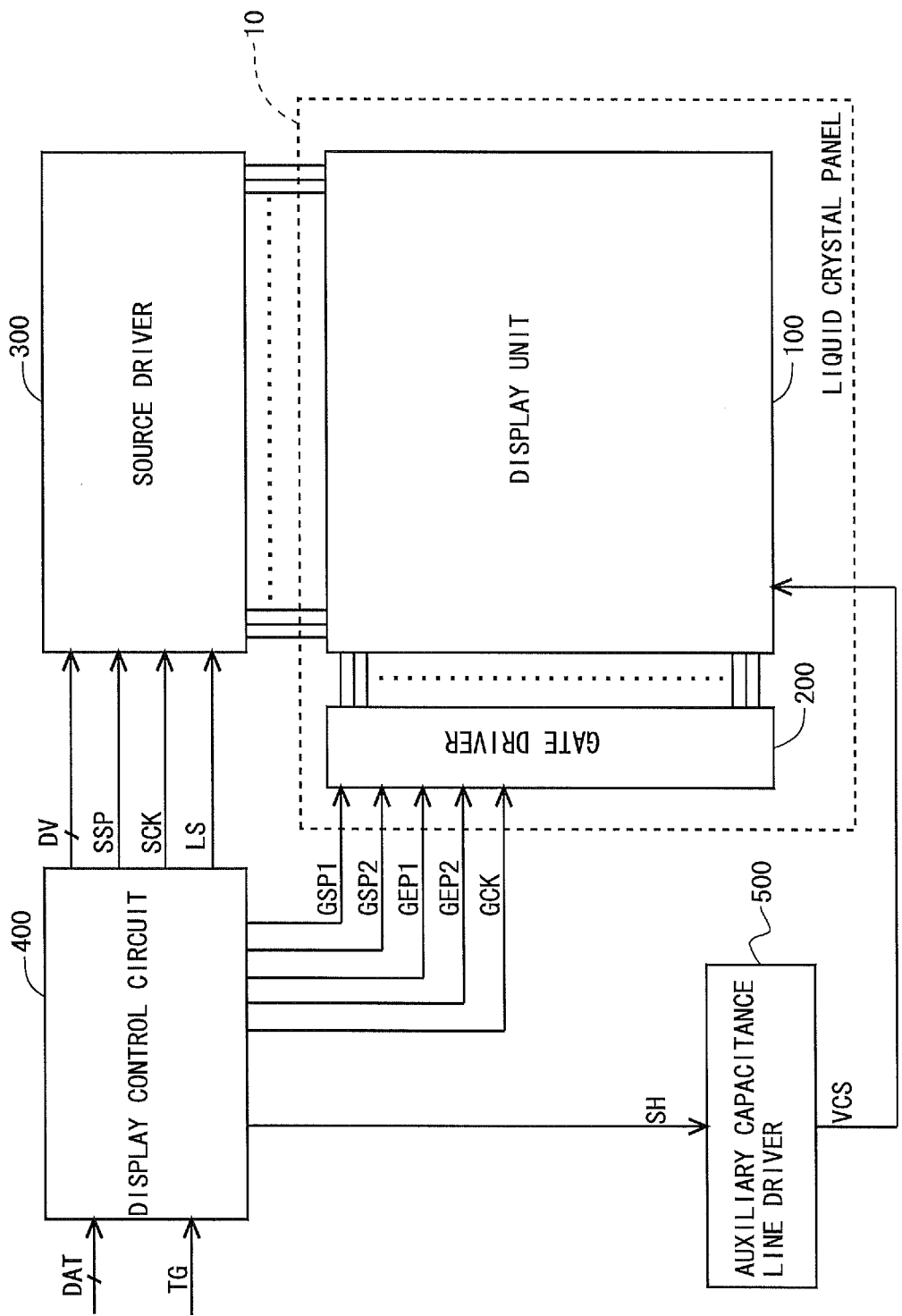
FIG. 2 is a block diagram illustrating a general configuration of the liquid crystal display device in the embodiment.

FIG. 2 is a block diagram illustrating a general configuration of an active matrix-type liquid crystal display device according to an embodiment of the present invention. As illustrated in FIG. 2, this liquid crystal display device has a liquid crystal panel 10 including a display unit 100 and a gate driver (a scanning signal line drive circuit) 200, a source driver (a video signal line drive circuit) 300, a display control circuit 400, and an auxiliary capacitance line driver 500. The source driver 300 is mounted on a glass substrate in a form of an IC chip. On the other hand, the gate driver 200 is formed monolithically on a glass substrate in the liquid crystal panel 10.

The display unit 100 is provided with a plurality of (m pieces of) source bus lines extending from the source driver 300, a plurality of (2n pieces of) gate bus lines extending from the gate driver 200, an auxiliary capacitance line extending from the auxiliary capacitance line driver 500, and a plurality of (n×m pieces of) pixel portions. The plurality of (2n pieces of) gate bus lines are divided into "n" pieces of first gate bus lines corresponding to first sub-pixel portions PixA which will be described later and "n" pieces of second gate bus lines corresponding to second sub-pixel portions PixB which will be described later. By the plurality of (n×m pieces of) pixel portions, a pixel matrix of n rows×m columns is formed. It should be noted that, in a general display device, color display is performed by three pixels of a pixel for R (red), a pixel for G (green), and a pixel for B (blue). In the description, as described above, a region, not an entire region for forming the three pixels, for forming a pixel of each of colors will be referred to as a "(one) pixel portion".

Figure 3:
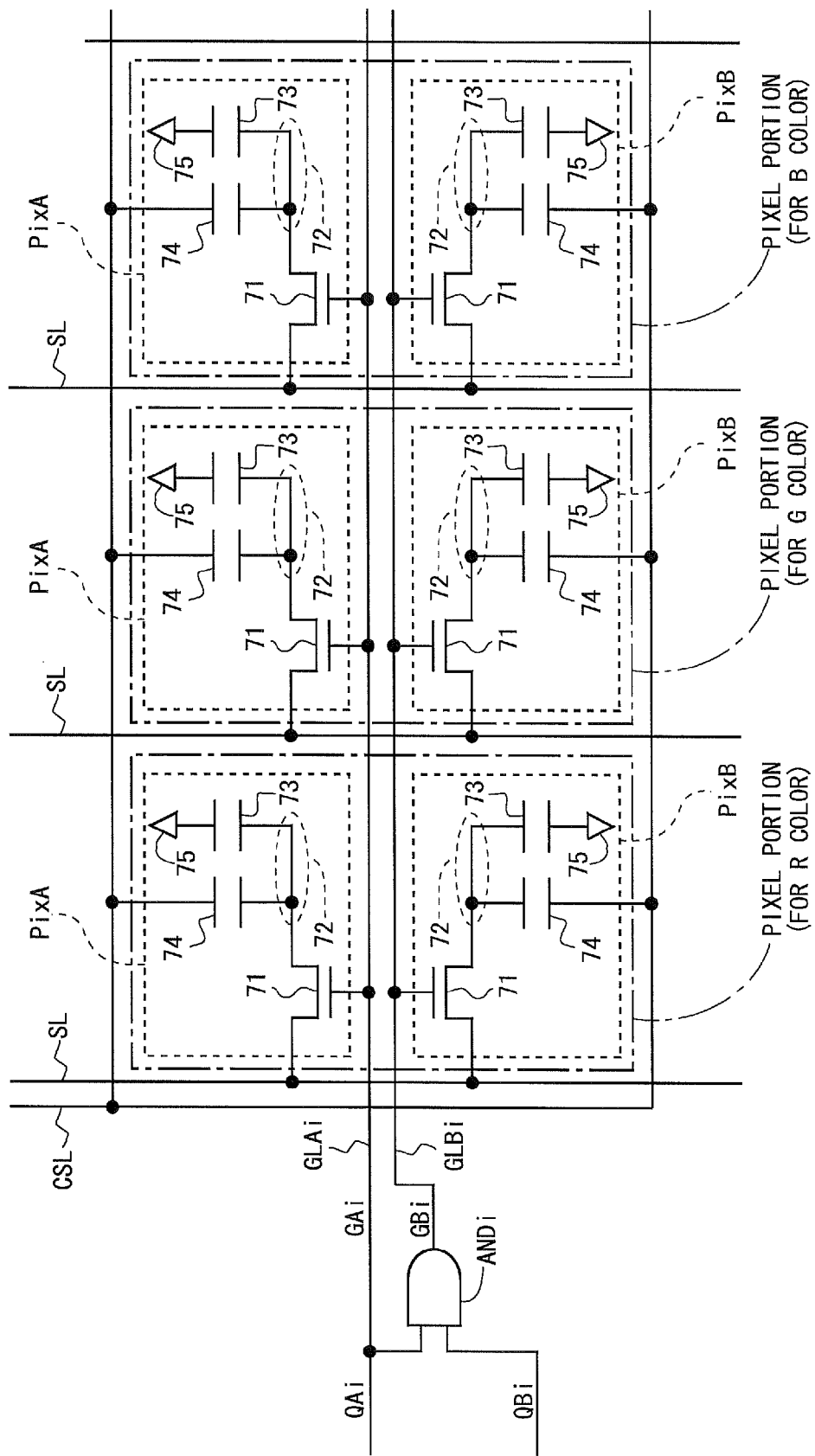
FIG. 3 is a circuit diagram illustrating the configuration of a pixel portion in a display unit in the embodiment.

FIG. 3 is a circuit diagram illustrating the configuration of a pixel portion in the display unit 100. As illustrated in FIG. 3, each of a pixel portion for R (red), a pixel portion for G (green), and a pixel portion for B (blue) is constructed by two sub-pixel portions (the first sub-pixel portion PixA and the second sub-pixel portion PixB). The sub-pixel portion includes a thin film transistor (TFT) 71 having a gate electrode connected to a gate bus line (a first gate bus line GLAi in the case of the first sub-pixel portion PixA, a second gate bus line GLBi in the case of the second sub-pixel portion PixB) (i=1 to n) passing a corresponding crossing point and a source electrode connected to the source bus line SL passing the crossing point, a pixel electrode 72 connected to a drain electrode of the thin film transistor 71, an counter electrode (common electrode) 75 and an auxiliary capacitance line (auxiliary capacitance electrode) CSL provided commonly to all of the sub pixel portions in the display unit 100, a liquid crystal capacitance 73 formed by the pixel electrode 72 and the counter electrode 75, and an auxiliary capacitance 74 formed by the pixel electrode 72 and the auxiliary capacitance line CSL. A pixel capacitance is formed by the liquid crystal capacitance 73 and the auxiliary capacitance 74. On the basis of a video signal received from the source bus line SL by the source electrode of the thin film transistor 71 when the gate electrode of each of the thin film transistors 71 receives active scanning signals from the gate bus lines GLAi and GLBi, voltage indicating a pixel value of the pixel capacitance is held. It should be noted that, in the embodiment, a first switching element, a first pixel electrode, and a first pixel capacitance are realized by the thin film transistor 71, the pixel electrode 72, and the pixel capacitance, respectively, in the first sub-pixel portion PixA. A second switching element, a second pixel electrode, and a second pixel capacitance are realized by the thin film transistor 71, the pixel electrode 72, and the pixel capacitance, respectively, in the second sub-pixel portion PixB.

Next, the operation of the configuration element illustrated in FIG. 2 will be described. The display control circuit 400 receives an image signal DAT and a timing signal group TG such as a horizontal synchronization signal and a vertical synchronization signal which are sent from the outside, and outputs a digital video signal DV, a source start pulse signal SSP, a source clock signal SCK, and a latch strobe signal LS for controlling the operation of the source driver 300, a first gate start pulse signal GSP1, a second gate start pulse signal GSP2, a first gate end pulse signal GEP1, a second gate end pulse signal GEP2, and a gate clock signal GCK for controlling the operation of the gate driver 200, and an auxiliary capacitance line control signal SH for controlling the operation of the auxiliary capacitance line driver 500.

The source driver 300 receives the digital video signal DV, the source start pulse signal SSP, the source clock signal SCK, and the latch strobe signal LS which are output from the display control circuit 400 and applies a video signal for driving to each of the source bus lines. The gate driver 200 receives the first gate start pulse signal GSP1, the second gate start pulse signal GSP2, the first gate end pulse signal GEP1, the second gate end pulse signal GSP2, and the gate clock signal GCK which are output from the display control circuit 400 and applies a scanning signal to each of the gate bus lines. The auxiliary capacitance line driver 500 applies a predetermined potential VCS to the auxiliary capacitance line CSL on the basis of the auxiliary capacitance line control signal SH which is output from the display control circuit 400.

As described above, by applying the video signal for driving to each of the source bus lines and applying the scanning signal to each of the gate bus lines, an image based on the image signal DAT sent from the outside is displayed in the display unit 100.

<2. Internal Configuration of Liquid Crystal Panel>

Figure 4:
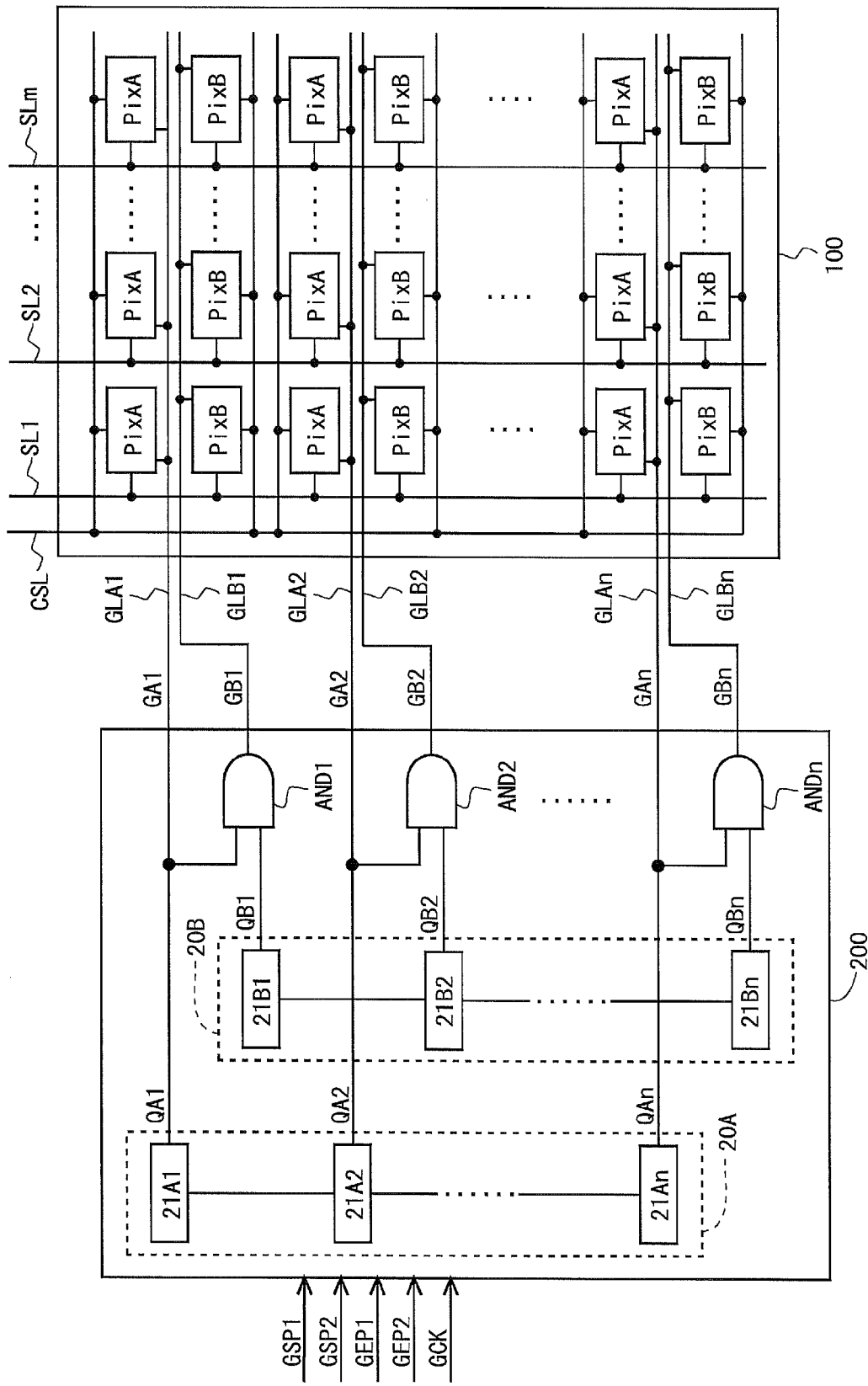
FIG. 4 is a block diagram illustrating an internal configuration of a liquid crystal panel in the embodiment.

FIG. 4 is a block diagram illustrating an internal configuration of the liquid crystal panel 10 in the embodiment. The liquid crystal panel 10 includes the display unit 100 in which a pixel matrix of n rows×m columns is formed, and the gate driver 200 for driving first gate bus lines GLA1 to GLAn and the second gate bus lines GLB1 to GLBn disposed in the display unit 100.

The gate driver 200 includes a shift register 20A made of n stages, a shift register 20B made of n stages, and n pieces of AND operation circuits AND1 to ANDn. As described above, the pixel matrix of n rows×m columns is formed in the display unit 100. Each of the stages in the shift register 20A, each of the stages in the shift register 20B, and an AND operation circuit are provided so as to correspond to each of the rows of the pixel matrix in a one-to-one corresponding manner. It should be noted that the shift register 20A is provided so as to correspond to the first sub-pixel portion PixA, and the shift register 20B is provided so as to correspond to the second sub-pixel portion PixB. Hereinafter, the shift register 20A will be referred to as "first shift register", and the shift register 20B will be referred to as "second shift register". A circuit constructing each of the stages of the shift register will be also referred to as "stage configuration circuit". In the embodiment, a first output signal generating stage is realized by the stage configuration circuit in the first shift register 20A, and a second output signal generating stage is realized by the stage configuration circuit in the second shift register 20B. By the AND operation circuits AND1 to ANDn, an AND operation unit is realized.

The first shift register 20A includes n pieces of stage configuration circuits 21A1 to 21An. The n pieces of the stage configuration circuits 21A1 to 21An are connected in series. From the n pieces of the stage configuration circuits 21A1 to 21An, output signals QA1 to QAn are output, respectively. Similarly, the second shift register 20B includes n pieces of stage configuration circuits 21B1 to 21Bn. The n pieces of the stage configuration circuits 21B1 to 21Bn are connected in series. From the n pieces of the stage configuration circuits 21B1 to 21Bn, output signals QB1 to QBn are output, respectively. The output signals QA1 to QAn from the first shift register 20A are applied as scanning signals GA1 to GAn to the first gate bus lines GLA1 to GLAn, respectively, and also given to one of input terminals of the AND operation circuits AND1 to ANDn. The output signals QB1 to QBn from the second shift register 20B are given to the other input terminals of the AND operation circuits AND1 to ANDn, respectively. The AND operation circuits AND1 to ANDn output signals expressing AND between the output signals QA1 to QAn and the output signals QB1 to QBn as scanning signals GB1 to GBn, respectively. It should be noted that, in the embodiment, the first output signals are realized by the output signals QA1 to QAn, and the second output signals are realized by the output signals QB1 to QBn.

In the display unit 100, the first sub-pixel portion PixA is connected to the first gate bus line GLAi, and the second sub-pixel portion PixB is connected to the second gate bus line GLBi. More specifically, the gate electrode of the thin film transistor 71 in the first sub-pixel portion PixA is connected to the first gate bus line GLAi, and the gate electrode of the thin film transistor 71 in the second sub-pixel portion PixB is connected to the second gate bus line GLBi (refer to FIG. 3). To the first gate bus lines GLA1 to GLAn, the output signals QA1 to QAn from the stage configuration circuits 21A1 to 21An in the first shift register 20A are applied as the scanning signals GA1 to GAn, respectively. To the second gate bus lines GLB1 to GLBn, signals expressing AND between the output signals QA1 to QAn from the stage configuration circuits 21A1 to 21An in the first shift register 20A and the output signals QB1 to QBn from the stage configuration circuits 21B1 to 21Bn in the second shift register 20B are applied as the scanning signals GB1 to GBn, respectively.

<3. Gate Driver>
<3.1 Detailed Configuration and Operation Outline of Gate Driver>

Figure 1:
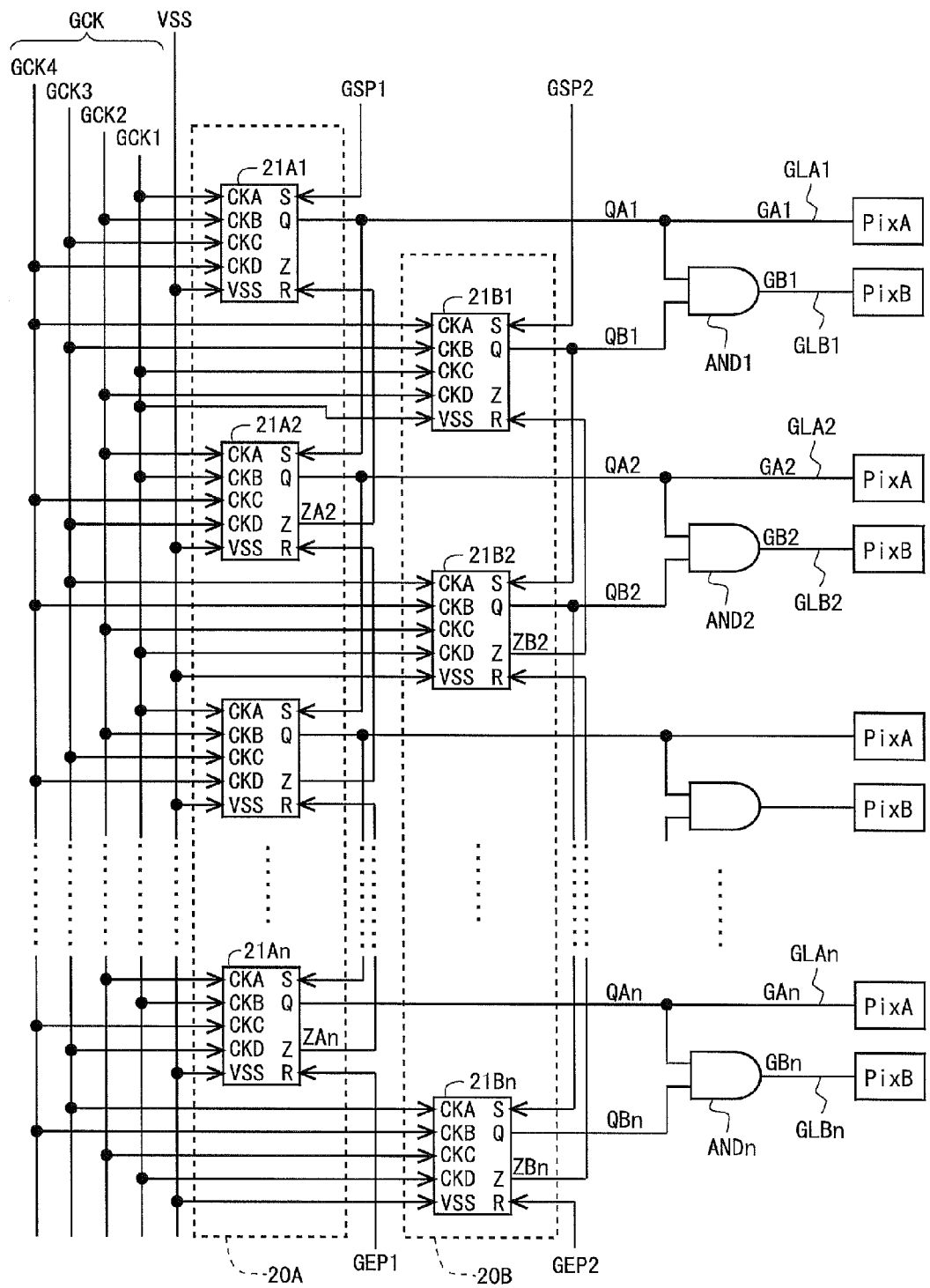
FIG. 1 is a block diagram illustrating a detailed configuration of a gate driver in an active matrix-type liquid crystal display device according to an embodiment of the present invention.

FIG. 1 is a block diagram illustrating the detailed configuration of the gate driver 200 in the embodiment. The gate driver 200 includes, as described above, the first shift register 20A, the second shift register 20B, and the n pieces of AND operation circuits AND1 to ANDn. Each of the stages (each of the stage configuration circuits) in the shift register (the first shift register 20A and the second shift register 20B) is provided with input terminals for receiving first to fourth clocks CKA to CKD, an input terminal for receiving DC power supply potential VSS of the low level, an input terminal for receiving a set signal 5, an input terminal for receiving a reset signal R, an output terminal for outputting an output signal Q, and an output terminal for outputting an output signal Z. It should be noted that the output signal Q and the output signal Z are typically signals having the same waveform. In the embodiment, for the purpose of, for example, preventing malfunction caused by unshaped waveform, the output signal Z is used in addition to the output signal Q. That is, a configuration in which only the output signal Q is output from each of the stages in the shift registers may be also employed.

Figure 5:
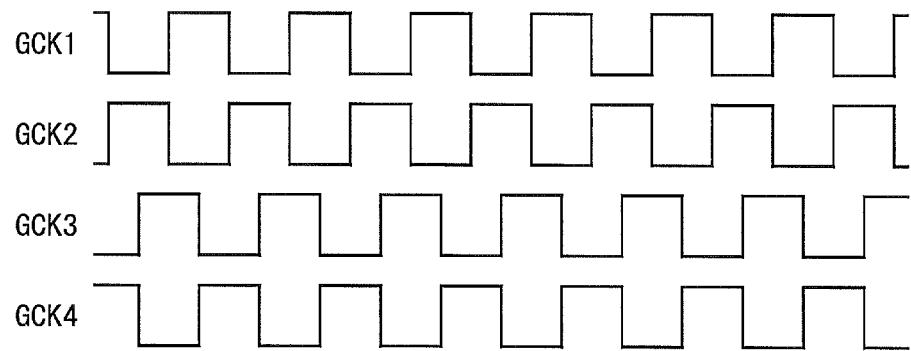
FIG. 5 is a waveform chart of first to fourth gate clock signals supplied to a gate driver in the embodiment.

As illustrated in FIG. 1, the gate clock signal GCK supplied to the gate driver 200 is constructed by four-phase clock signals (the first to fourth gate clock signals GCK1 to GCK4). Signals received as the first to fourth clocks CKA to CKD by each of the state configuration circuits are any of the first to fourth gate clock signals GCK1 to GCK4. FIG. 5 is a waveform chart of the first to fourth gate clock signals GCK1 to GCK4 supplied to the gate driver 200. The phases of the first gate clock signal GCK1 and the second gate clock signal GCK2 are deviated from each other by 180 degrees, the phases of the third gate clock signal GCK3 and the fourth gate clock signal GCK4 are deviated from each other by 180 degrees. The phase of the fourth gate clock signal GCK4 is delayed from the phase of the first gate clock signal GCK1 by 90 degrees, and the phase of the third gate clock signal GCK3 is delayed from the phase of the second gate clock signal GCK2 by 90 degrees. The on-duty of the first to fourth gate clock signals GCK1 to GCK4 is almost the half. It should be noted that, in the embodiment, the first clock signal group is realized by the first gate clock signal GCK1 and the second gate clock signal GCK2, and the second clock signal group is realized by the third gate clock signal GCK3 and the fourth gate clock signal GCK4.

Signals to be supplied to the input terminals of the stages (stage configuration circuits) in the first shift register 20A are as follows. As for odd-numbered stages, the first gate clock signal GCK1 is supplied as the first clock CKA, and the second gate clock signal GCK2 is supplied as the second clock CKB. As for even-numbered stages, the second gate clock signal GCK2 is supplied as the first clock CKA, and the first gate clock signal GCK1 is supplied as the second clock CKB. Moreover, as for any stage, the output signal Q from the preceding stage is supplied as the set signal S, and the output signal Z from the following stage is supplied as the reset signal R. Exceptionally, as for the first stage, the first gate start pulse signal GSP1 is supplied as the set signal S. Moreover, as for the n-th stage (final stage), the first gate end pulse signal GEP1 is supplied as the reset signal R. It should be noted that the DC power supply potential VSS at the low level is commonly supplied to all stage configuration circuits. From each of the stages (each of the stage configuration circuits) in the first shift register 20A, the output signal Q and the output signal Z are output. The output signals Q (QA1 to QAn) from each of the stages are supplied as the scanning signals GA1 to GAn to the corresponding first gate bus lines GLA1 to GLAn, respectively, and also supplied as the set signals S to the following stages. The output signal Z from each of the stages is supplied as the reset signal R to the preceding stage.

In the above-described configuration, when the pulse of the first gate start pulse signal GSP1 as the set signal S is supplied to the first stage in the first shift register 20A, on the basis of the first gate clock signal GCK1 and the second gate clock signal GCK2, the shift pulse included in the output signal Q from each of the stages is sequentially transferred from the first stage to the n-th stage. In accordance with the transfer of the shift pulse, the output signals QA1 to QAn from the first shift register 20A sequentially become the high level by predetermined periods.

The second shift register 20B has a configuration similar to that of the first shift register 20A. However, as for the odd-numbered stages, the fourth gate clock signal GCK4 is supplied as the first clock CKA, and the third gate clock signal GCK3 is supplied as the second clock CKB. As for the even-numbered stages, the third gate clock signal GCK3 is supplied as the first clock CKA, and the fourth gate clock signal GCK4 is supplied as the second clock CKB. Further, as for the first stage, the second gate start pulse signal GSP2 is supplied as the set signal S. As for the final stage, the second gate end pulse signal GEP2 is supplied as the reset signal R. The output signals QB1 to QBn from the second shift register 20B also sequentially become the high level by predetermined periods.

<3.2 AND Operation Circuit>

Figure 6:
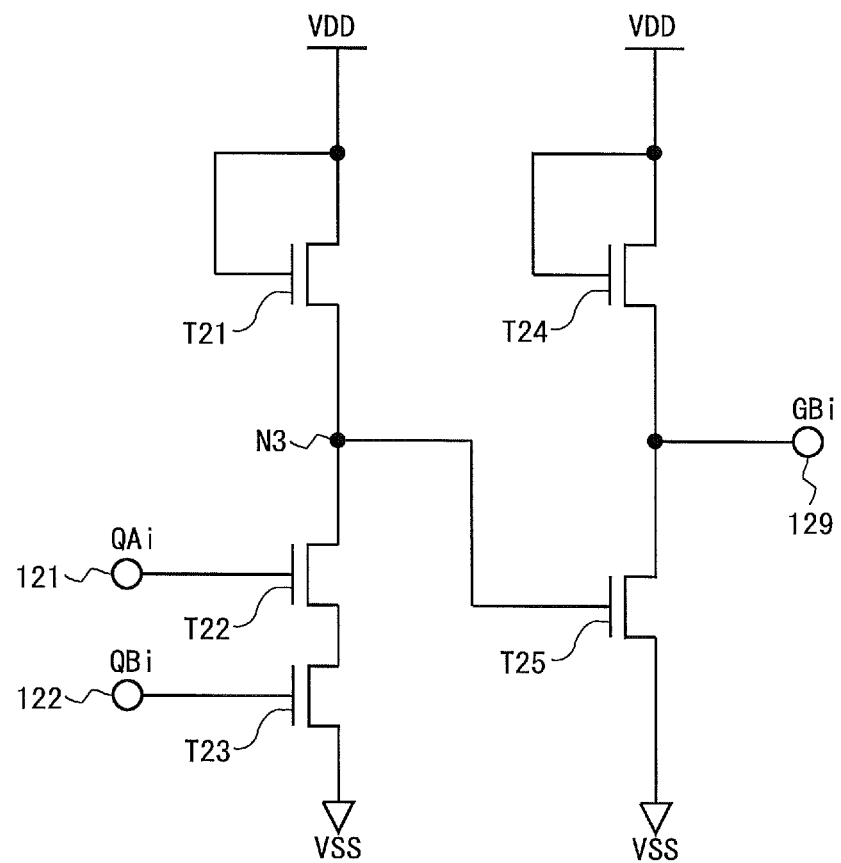
FIG. 6 is a circuit diagram illustrating the configuration of an AND operation circuit in the embodiment.

FIG. 6 is a circuit diagram illustrating the configuration of an AND operation circuit ANDi in the embodiment. The AND operation circuit ANDi has five thin film transistors T21 to T25, two input terminals 121 and 122, and an output terminal 129. All of the thin film transistors T21 to T25 are of the N channel type. The thin film transistors T21 and T24 are diode-connected to the input terminals for the DC power supply potential VDD. As for the thin film transistor T21, the DC power supply potential VDD is applied to the gate terminal and the drain terminal, and the source terminal is connected to a node N3. As for the thin film transistor T22, the gate terminal is connected to the input terminal 121, the drain terminal is connected to the node N3, and the source terminal is connected to the drain terminal of the thin film transistor T23. As for the thin film transistor T23, the gate terminal is connected to the input terminal 122, the drain terminal is connected to the source terminal of the thin film transistor T22, and the DC power supply potential VSS is applied to the source terminal. As for the thin film transistor T24, the DC power supply potential VDD is supplied to the gate terminal and the drain terminal, and the source terminal is connected to the output terminal 129. As for the thin film transistor T25, the gate terminal is connected to the node N3, the drain terminal is connected to the output terminal 129, and the DC power supply potential VSS is applied to the source terminal.

In a configuration as described above, the output signal QAi from the first shift register 20A is supplied to the input terminal 121, and the output signal QBi from the second shift register 20B is supplied to the input terminal 122. When both of the output signal QAi and the output signal QBi are at the high level, both of the thin film transistor T22 and the thin film transistor T23 become the on state, so that the potential of the node N3 becomes the low level. Consequently, the thin film transistor T25 becomes an off state. As a result, the scanning signal GBi output from the output terminal 129 becomes the high level. On the other hand, when at least one of the output signal QAi and the output signal QBi is at the low level, at least one of the thin film transistor T22 and the thin film transistor T23 becomes the off state, so that the potential of the node N3 becomes the high level. Consequently, the thin film transistor T25 becomes an on state. As a result, the scanning signal GBi output from the output terminal 129 becomes the low level.

It should be noted that the configuration may be such that all of the thin film transistors T21 to T25 in the AND operation circuit AND are of the P-channel type, and the logic voltages are inverted to the configuration illustrated in FIG. 6 (the voltage indicative of the on state and the voltage indicative of the off stage are interchanged). Moreover, the diode-connected thin film transistors T21 and T24 may be of an enhanced type or a depletion type. Further, a configuration using load resistors in place of the diode-connected thin film transistors T21 and T24 may be employed. With respect to this, for example, a load resistor may be formed by using a silicon layer of the thin film transistor. Further, with a CMOS configuration using both of the N-channel type and the P-channel type, the AND operation circuit AND can be also realized (see a second modification which will be described later).

<3.3 Configuration of Stage Configuration Circuit>

Figure 7:
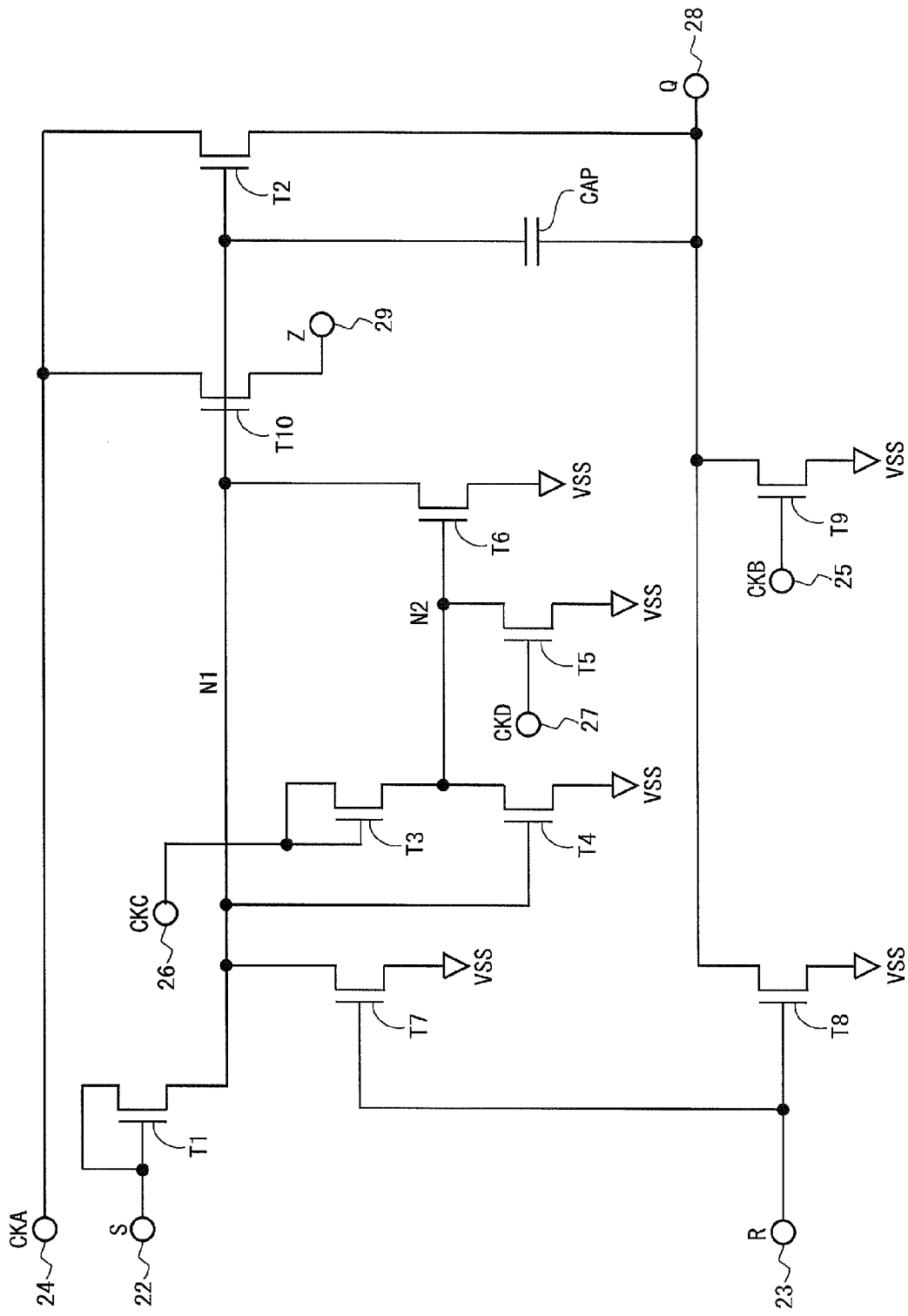
FIG. 7 is a circuit diagram illustrating the configuration of a stage configuration circuit (the configuration of one stage in a shift register) in the embodiment.

FIG. 7 is a circuit diagram illustrating the configuration of a stage configuration circuit (the configuration of one stage in a shift register). As illustrated in FIG. 7, the stage configuration circuit has ten thin film transistors T1 to T10 and one capacitor CAP. All of the thin film transistors T1 to T10 are of the N-channel type. The stage configuration circuit has an input terminal for the low-level DC power supply potential VSS and, in addition, six input terminals 22 to 27 and two output terminals 28 and 29. Reference numeral 22 is designated to the input terminal receiving the set signal S, reference numeral 23 is designated to the input terminal receiving the reset signal R, reference numeral 24 is designated to the input terminal receiving the first clock CKA, reference numeral 25 is designated to the input terminal receiving the second clock CKB, reference numeral 26 is designated to the input terminal receiving the third clock CKC, and reference numeral 27 is designated to the input terminal receiving the fourth clock CKD. Reference numeral 28 is designated to the output terminal for the output signal Q, and reference numeral 29 is designated to the output terminal for the output signal Z.

The source terminal of the thin film transistor T1, the gate terminal of the thin film transistor T2, the gate terminal of the thin film transistor T4, the drain terminal of the thin film transistor T6, the drain terminal of the thin film transistor T7, the gate terminal of the thin film transistor T10, and one end of the capacitor CAP are connected to one another. Hereinafter, an area (line) in which they are connected to one another will be referred to as "first node" and reference numeral N1 is designated. The source terminal of the thin film transistor T3, the drain terminal of the thin film transistor T4, the drain terminal of the thin film transistor T5, and the gate terminal of the thin film transistor T6 are connected to one another. Hereinafter, an area (line) in which they are connected to one another will be referred to as "second node" and reference numeral N2 is designated.

As for the thin film transistor T1, the gate terminal and the drain terminal are connected to the input terminal 22 (that is, diode-connected), and the source terminal is connected to the first node Ni. As for the thin film transistor T2, the gate terminal is connected to the first node N1, the drain terminal is connected to the input terminal 24, and the source terminal is connected to the output terminal 28. As for the thin film transistor T3, the gate terminal and the drain terminal are connected to the input terminal 26 (that is, diode-connected), and the source terminal is connected to the second node N2. As for the thin film transistor T4, the gate terminal is connected to the first node N1, the drain terminal is connected to the second node N2, and the DC power supply potential VSS is applied to the source terminal. As for the thin film transistor T5, the gate terminal is connected to the input terminal 27, the drain terminal is connected to the second node N2, and the DC power supply potential VSS is applied to the source terminal.

As for the thin film transistor T6, the gate terminal is connected to the second node N2, the drain terminal is connected to the first node N1, and the DC power supply potential VSS is applied to the source terminal. As for the thin film transistor T7, the gate terminal is connected to the input terminal 23, the drain terminal is connected to the first node N1, and the DC power supply potential VSS is applied to the source terminal. As for the thin film transistor T8, the gate terminal is connected to the input terminal 23, the drain terminal is connected to the output terminal 28, and the DC power supply potential VSS is applied to the source terminal. As for the thin film transistor T9, the gate terminal is connected to the input terminal 25, the drain terminal is connected to the output terminal 28, and the DC power supply potential VSS is applied to the source terminal. As for the thin film transistor T10, the gate terminal is connected to the first node N1, the drain terminal is connected to the input terminal 24, and the source terminal is connected to the output terminal 29.

The function in the stage configuration circuit of each of configuration elements will now be described. The thin film transistor T1 changes the potential of the first node N1 toward the high level when the set signal S is at the high level. The thin film transistor T2 supplies the potential of the first clock CKA to the output terminal 28 when the potential of the first node N1 is at the high level. The thin film transistor T3 changes the potential of the second node N2 toward the high level when the third clock CKC is at the high level. The thin film transistor T4 changes the potential of the second node N2 toward the DC power supply potential VSS when the potential of the first node N1 is at the high level. The thin film transistor T5 changes the potential of the second node N2 toward the DC power supply potential VSS when the fourth clock CKD is at the high level. The thin film transistor T6 changes the potential of the first node N1 toward the DC power supply potential VSS when the potential of the second node N2 is at the high level. The thin film transistor T7 changes the potential of the first node N1 toward the DC power supply potential VSS when the reset signal R is at the high level. The thin film transistor T8 changes the potential of the output terminal 28 toward the DC power supply potential VSS when the reset signal R is at the high level. The thin film transistor T9 changes the potential of the output terminal 28 toward the DC power supply potential VSS when the second clock CKB is at the high level. The thin film transistor T10 supplies the potential of the first clock CKA to the output terminal 29 when the potential of the first node N1 is at the high level. The capacitor CAP functions as a compensation capacitance for maintaining the potential of the first node N1 at the high level during a predetermined period (from the time point t10 to time point t14 in FIG. 8).

It should be noted that, in the embodiment, an output control switching element is realized by the thin film transistor T2, a first node turning on switching element is realized by the thin film transistor T1, and an output node turning off switching element is realized by the thin film transistor T8. Moreover, by the first clock CKA supplied to the input terminal 24, a stage output control clock is realized.

<4. Operation>
<4.1 Operation of Stage Configuration Circuit>

Figure 8:
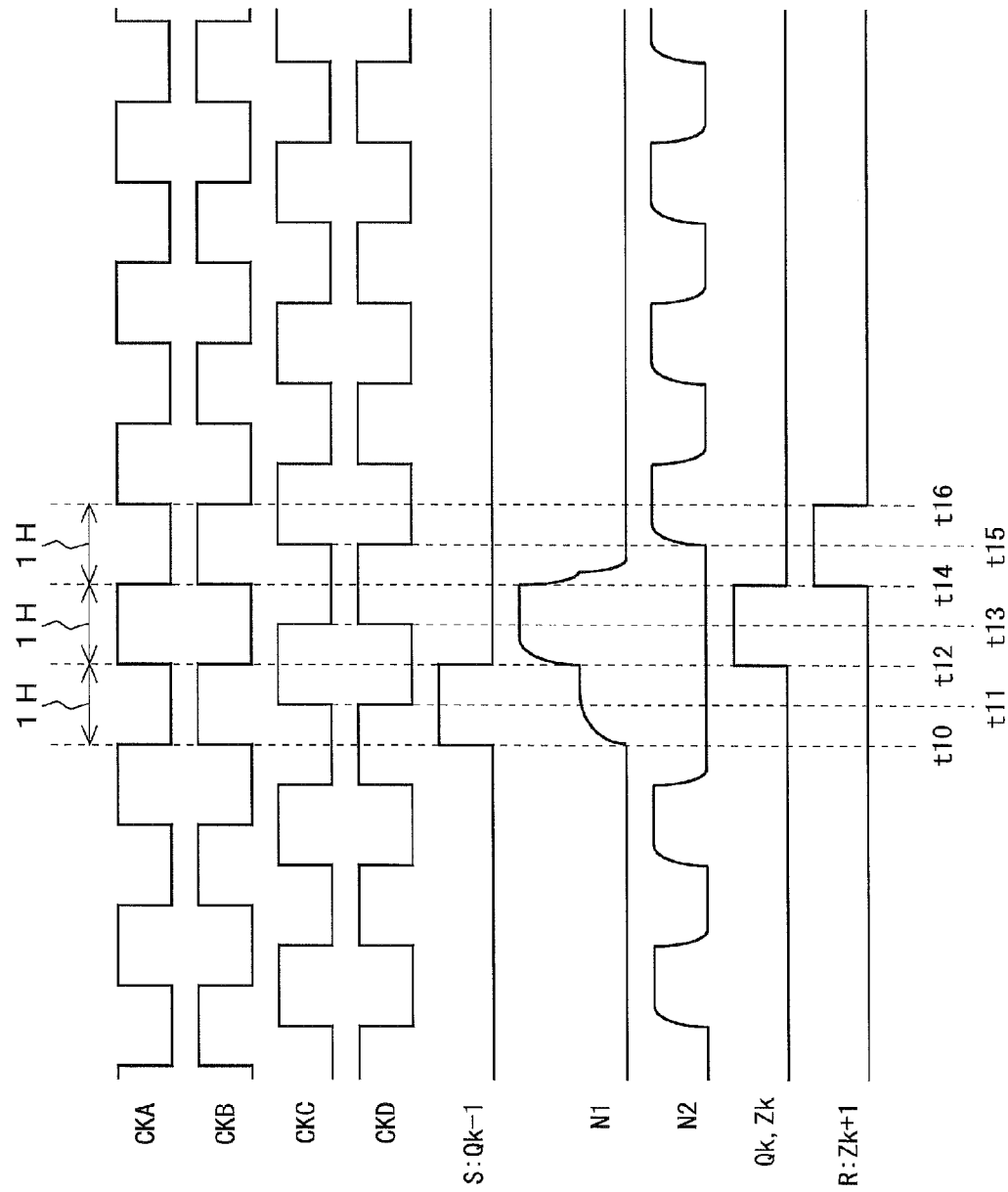
FIG. 8 is a signal waveform chart for explaining the operation of the stage configuration circuit in the embodiment.

With reference to FIGS. 7 and 8, the operation of the stage configuration circuit in the embodiment will be described. It should be noted that attention is paid to a stage configuration circuit in the k-th stage in each of the shift registers and it is assumed that an output signal Qk is set to the high level during the period from time point t12 to time point t14. As illustrated in FIG. 8, in a period before time point t10, the potential of the first node N1 and the potential of the output signal Qk (output terminal 28) are at the low level. During the operation of the liquid crystal display device, the first clock CKA, the second clock CKB, the third clock CKC, and the fourth clock CKD having waveforms as illustrated in FIG. 8 are supplied to the input terminals 24 to 27 in the stage configuration circuit, respectively.

At the time point t10, the pulse of the set signal S is supplied to the input terminal 22. Since the configuration is such that the thin film transistor T1 is diode-connected to the input terminal 22, the potential of the first node N1 rises by the pulse of the set signal S. Since the set signal S is maintained at the high level state until the time point t12, the first node N1 is pre-charged in the period from the time point t10 to the time point t12. Since the gate terminal of the thin film transistor T4 is connected to the first node N1, the thin film transistor T4 is maintained in the on state during this period. Consequently, the thin film transistor T6 is maintained in the off state during the period from the time point t10 to the time point t12. Moreover, during this period, since the reset signal R is maintained at the low level, the thin film transistor T7 is maintained in the off state. Therefore, the potential of the first node N1 increased by the pre-charging does not decrease during this period.

At time point t11, the third clock CKC changes from the low level to the high level. Since the configuration is such that the thin film transistor T3 is diode-connected to the input terminal 26, the potential of the second node N2 intends to rise. However, as described above, the thin film transistor T4 is maintained in the on state during the period from the time point t10 to the time point t12. Consequently, after the time point t11, the potential of the second node N2 is maintained at the low level.

At the time point t12, the first clock CKA changes from the low level to the high level. The drain terminal of the thin film transistor T2 is connected to the input terminal 24, a parasitic capacitance exists between the gate and drain of the thin film transistor T2, and a parasitic capacitance exists between the gate and source of the thin film transistor T2. Consequently, as the drain potential of the thin film transistor T2 rises, the potential of the first node N1 also rises (the first node N1 is bootstrapped). As a result, the thin film transistors T2 and T10 become the on state. Since the state where the first clock CKA is set to the high level is maintained until the time point t14, during the period from the time point t12 to the time point t14, the output signal Qk and the output signal Zk become the high level. It should be noted that, during the period from the time point t12 to the time point t14, since the thin film transistor T4 is maintained in the on state, the potential of the second node N2 is maintained at the low level, and the thin film transistor T6 is maintained in the off state. Moreover, during the period from the time point t12 to the time point t14, since the reset signal R is maintained at the low level, the thin film transistors T7 and T8 are maintained in the off state. Consequently, the potential of the first node N1 and the potential of the output signal Qk (output terminal 28) do not decrease during the period.

At time point t13, the fourth clock CKD changes from the low level to the high level. The state where the fourth clock CKD is set to the high level is maintained until time point t15. Consequently, during the period from the time point t13 to the time point t15, the thin film transistor T5 is in the off state, and the potential of the second node N2 is maintained at the low level.

At the time point t14, the first clock CKA changes from the high level to the low level. Accordingly, with decrease of the potential of the input terminal 24, the potential of the output terminals 28 and 29 decreases and, further, the potential of the first node N1 also decreases via the parasitic capacitance in the thin film transistor T2. Also at the time point t14, the reset signal R changes from the low level to the high level. Accordingly, the thin film transistors T7 and T8 become the on state. By the thin film transistor T7 becoming in the on state, the potential of the first node N1 decreases. By the thin film transistor T8 becoming in the on state, the potential of the output terminal 28 decreases. In such a manner, at the time point t14, the output signal Qk and the output signal Zk become the low level.

At the time point t15, the fourth clock CKD changes from the high level to the low level. Consequently, the thin film transistor T5 becomes the off state. At the time point t15, the third clock CKC changes from the low level to the high level. At this time, since the potential of the first node N1 is at the low level and the thin film transistor T4 is in the off state, the potential of the second node N2 rises by the change of the third clock CKC to the high level. Consequently, the thin film transistor T6 becomes the on state, and the potential of the first node N1 is maintained at the low level.

At time point t16, the reset signal R changes from the high level to the low level. At the time point t16, the first clock CKA changes from the low level to the high level. At this time, the potential of the first node N1 is to rise due to the parasitic capacitance in the thin film transistor T2. However, since the thin film transistor T6 is in the on state as described above, the potential of the first node N1 is maintained at the low level.

<4.2 Operation of Gate Driver>

Figure 9:
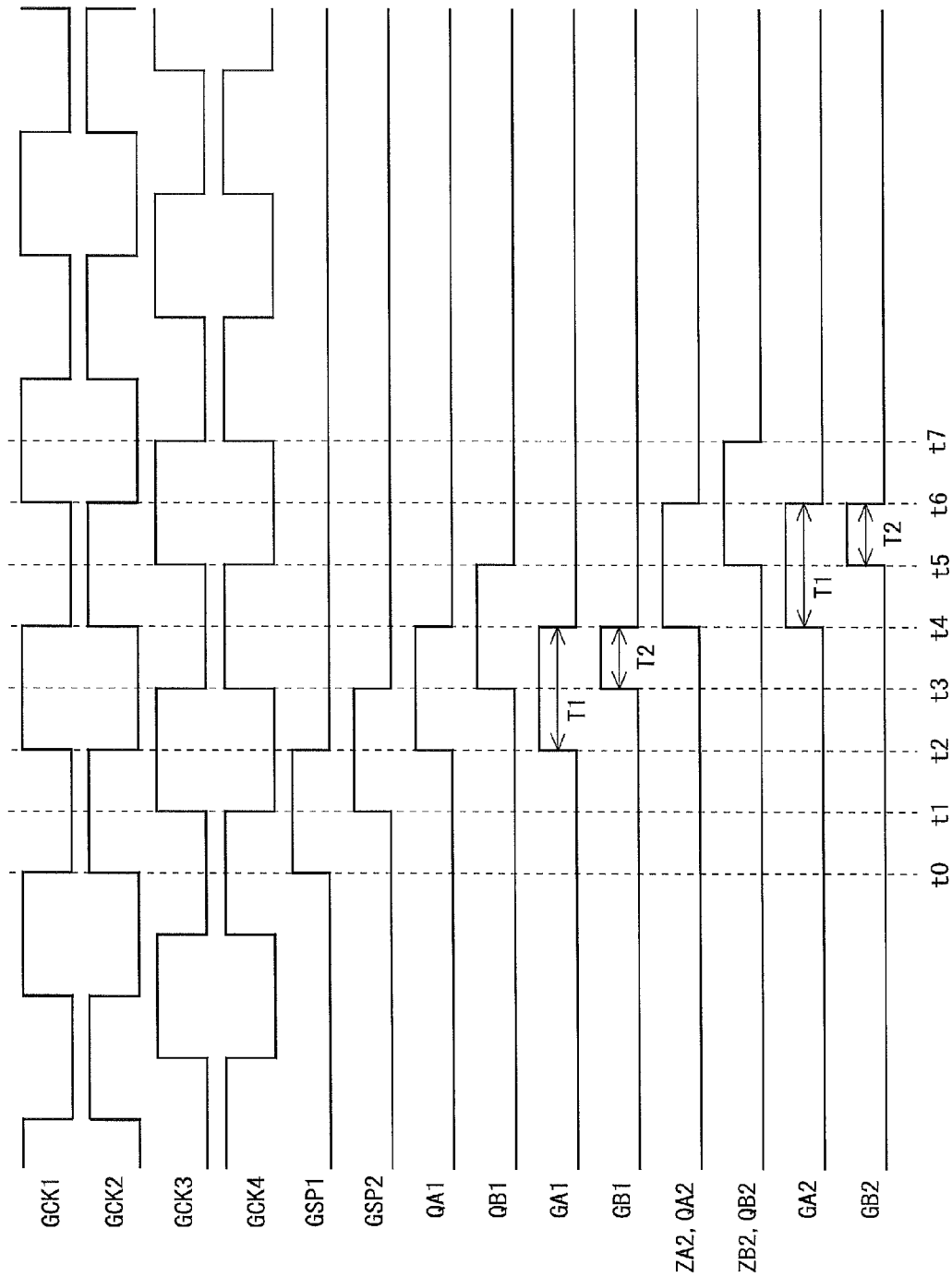
FIG. 9 is a signal waveform chart for explaining the operation of the gate driver in the embodiment.

On the basis of the above-described operation of the stage configuration circuit, the operation of the gate driver 200 will be described with reference to FIG. 9. Through the operation period of the liquid crystal display device, the first to fourth gate clock signals GCK1 to GCK4 having the waveforms as illustrated in FIG. 9 are supplied to the gate driver 200.

At time point t0, the pulse of the first gate start pulse signal GSP1 is supplied to the first shift register 20A. The pulse is input as the set signal S to the stage configuration circuit 21A1 in the first stage of the first shift register 20A. It should be noted that, during the period from the time point t0 to time point t2, the first gate clock signal GCK1 supplied as the first clock CKA to the stage configuration circuit 21A1 is maintained at the low level, so that the output signal QA1 from the stage configuration circuit 21A1 is maintained at the low level.

At time point t1, the pulse of the second gate start pulse signal GSP2 is supplied to the second shift register 20B. The pulse is input as the set signal S to the stage configuration circuit 21B1 in the first stage of the second shift register 20B. It should be noted that, during the period from the time point t1 to the time point t2, the fourth gate clock signal GCK4 supplied as the first clock CKA to the stage configuration circuit 21B1 is maintained at the low level, so that the output signal QB1 from the stage configuration circuit 21B1 is maintained at the low level.

At the time point t2, the first gate clock signal GCK1 changes from the low level to the high level. Consequently, the output signal QA1 from the stage configuration circuit 21A1, that is, the scanning signal GA1 changes from the low level to the high level. At the time point t2, since the fourth gate clock signal GCK4 is at the low level, the output signal QB1 from the stage configuration circuit 21B1 is maintained at the low level. Therefore, at the time point t2, the scanning signal GB1 output from the AND operation circuit AND1 is maintained at the low level.

At time point t3, the fourth gate clock signal GCK4 changes from the low level to the high level. Consequently, the output signal QB1 from the stage configuration circuit 21B1 changes from the low level to the high level. At the time point t3, since the first gate clock signal GCK1 is at the high level, the output signal QA1 from the stage configuration circuit 21A1 is maintained at the high level. Therefore, at the time point t3, the scanning signal GB1 output from the AND operation circuit AND1 changes from the low level to the high level.

At time point t4, the second gate clock signal GCK2 changes from the low level to the high level. At the time point t2, the pulse of the output signal QA1 from the stage configuration circuit 21A1 is already supplied as the set signal S to the stage configuration circuit 21A2 in the second stage of the first shift register 20A. Consequently, at the time point t4, the output signal ZA2 from the stage configuration circuit 21A2 changes from the low level to the high level. The output signal ZA2 is supplied as the reset signal R to the stage configuration circuit 21A1. Accordingly, at the time point t4, the output signal QA1, that is, the scanning signal GA1 changes from the high level to the low level. Moreover, at the time point t4, by the output signal QA1 changing from the high level to the low level, the scanning signal GB1 output from the AND operation circuit AND1 changes from the high level to the low level.

At time point t5, the third gate clock signal GCK3 changes from the low level to the high level. At the time point t3, the pulse of the output signal QB1 from the stage configuration circuit 21B1 is already supplied as the set signal S to the stage configuration circuit 21B2 in the second stage of the second shift register 20B. Consequently, at time point t5, the output signal ZB2 from the stage configuration circuit 21B2 changes from the low level to the high level. The output signal ZB2 is supplied as the reset signal R to the stage configuration circuit 21B1. Accordingly, at the time point t5, the output signal QB1 changes from the high level to the low level.

The operation as described above is repeated, so that the scanning signals GA1 to GAn which become the high level sequentially every period having a length indicated by reference numeral T1 in FIG. 9 (hereinafter, also simply referred to as "period T1") are sequentially supplied to the first gate bus lines GLA1 to GLAn line by line. Moreover, the scanning signals GB1 to GBn which become the high level sequentially every period having a length indicated by reference numeral T2 in FIG. 9 (hereinafter, also simply referred to as "period T2") are sequentially supplied to the second gate bus lines GLB1 to GLBn line by line. Consequently, in the first sub-pixel portion PixA connected to the first gate bus lines GLA1 to GLAn, the pixel capacitance is charged for the period having the length indicated by the reference numeral T1. On the other hand, in the second sub-pixel portion PixB connected to the second gate bus lines GLB1 to GLBn, the pixel capacitance is charged for the period having the length indicated by the reference numeral T2.

<5. Charging in the Sub-Pixel Portion>

Next, how the pixel capacitance is charged in the first sub-pixel portion PixA and the second sub-pixel portion PixB by the gate driver 200 operating as described above will be explained. In the embodiment, the phases of the first and second gate clock signals GCK1 and GCK2 are deviated from those of the third and fourth gate clock signals GCK3 and GCK4 by 90 degrees (refer to FIG. 9). Therefore, as for in FIG. 9, for the relationship between the length of the period T1 and the length of the period T2, the following equation (1) is satisfied.

$$T2=(1/2) \times T1 \qquad (1)$$

Figure 10:
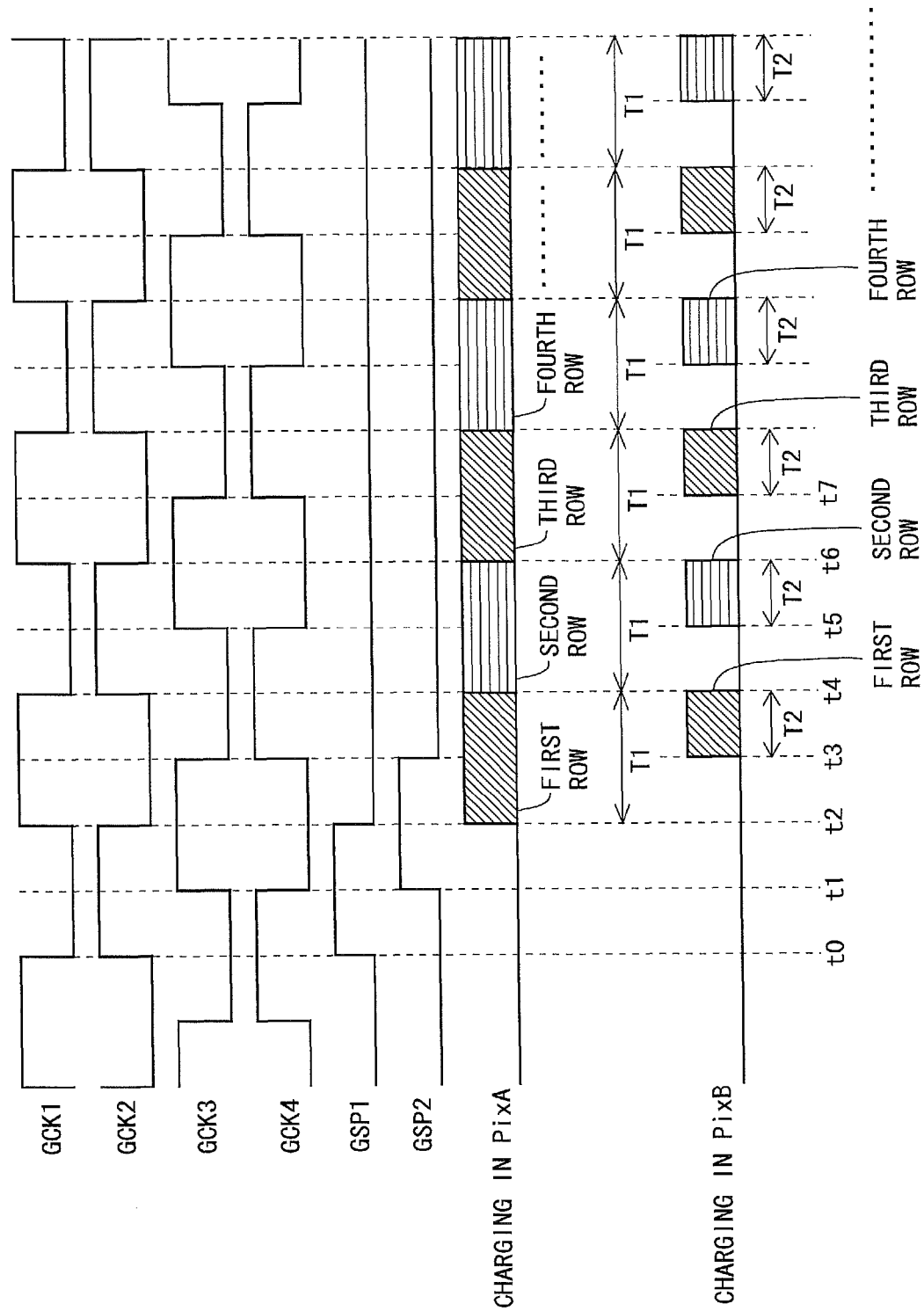
FIG. 10 is a diagram for explaining charging in a sub-pixel portion in the embodiment.

Consequently, in each of the rows, the length of the charging period in the second sub-pixel portion PixB is the half of the length of the charging period in the first sub-pixel portion PixA. It should be noted that FIG. 10 schematically illustrates charging periods in the first sub-pixel portion PixA and the second sub-pixel portion PixB.

Figures 11, 12:
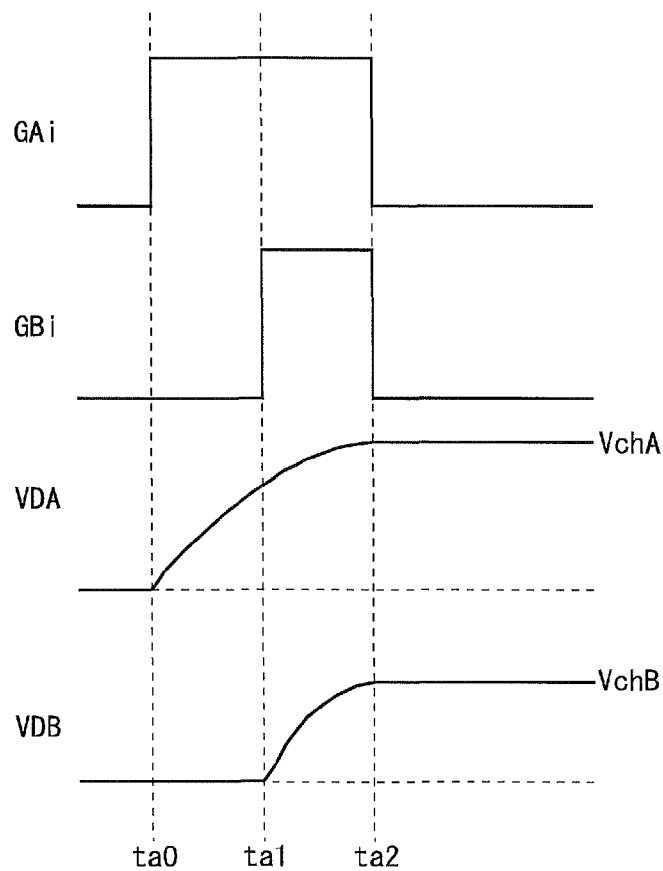
FIG. 11 is a signal waveform chart for explaining charging in the sub-pixel portion in the embodiment.
FIG. 12 is a diagram for explaining effects of IC chip reduction in the embodiment.

As illustrated in FIG. 11, when the scanning signal GAi applied to the first gate bus line GLAi rises, for example, at time point ta0, in the first sub-pixel portion PixA (refer to FIG. 3) connected to the first gate bus line GLAi, gate voltage in the thin film transistor 71 becomes the on level, and a drain potential of the thin film transistor 71 (the potential of the pixel electrode 72) VDA gradually rises from the time point ta0. The scanning signal GAi falls at a time point ta2 whereas the drain potential VDA rises to VchA at the time point ta2. The potential VchA becomes a charging potential in the first sub-pixel portion PixA. At time point ta1, the scanning signal GBi applied to the second gate bus line GLBi rises. Consequently, in the second sub-pixel portion PixB connected to the second gate bus line GLBi, the gate voltage in the thin film transistor 71 becomes the on level, and the drain potential VDB of the thin film transistor 71 gradually rises from the time point ta1. The scanning signal GBi falls at the time point ta2 whereas the drain potential VDB rises to VchB at the time point ta2. The potential VchB becomes a charging potential in the second sub-pixel portion PixB. Since the above equation (1) is satisfied, for the relationship between the charging potential VchA in the first sub-pixel portion PixA and the charging potential VchB in the second sub-pixel portion PixB, the following equation (2) is satisfied.

$$VchA = Z \times VchB \quad (2)$$

where Z denotes a parameter which depends on the length of a gate-on period of the thin film transistor 71 in the first sub-pixel portion PixA and the second sub-pixel portion PixB.

Generally, since Q=C×V (Q: charge amount, C: capacitance value of capacitor, V: voltage between both ends of capacitor) is satisfied, when charge amount to be charged is Qd, drain potential (charging potential) is Vd, and drain capacitance is Cd, the following equation (3) is satisfied on assumption that the potentials of the counter electrode (common electrode) 75 and the auxiliary capacitance line (auxiliary capacitance electrode) CSL are zero.

$$Vd = Qd/Cd \quad (3)$$

With respect to the first sub-pixel portion PixA, when charge amount to be charged is QdA and drain capacitance is CdA, from the above equation (3), charging potential VchA is expressed by the following equation (4).

$$VchA = QdA/CdA \quad (4)$$

Further, with respect to the second sub-pixel portion PixB, when charge amount to be charged is QdB and drain capacitance is CdB, from the above equation (3), charging potential VchB is expressed by the following equation (5).

$$VchB = QdB/CdB \quad (5)$$

charge amount Qd to be charged can be controlled by charge amount Qtft which can be passed in unit time by the thin film transistor 71, that is, magnitude of current Id and length of the gate on period of the thin film transistor 71. Therefore, with respect to the above equations (4) and (5), even when CdA and CdB are made equal to each other and the same source potential (the potential of the video signal) is applied to the first sub-pixel portion PixA and the second sub-pixel portion PixB, by making the length of the gate on period of the thin film transistor 71 different between the first sub-pixel portion PixA and the second sub-pixel portion PixB, VchA and VchB can be made different from each other.

<6. Effect>

According to the embodiment, in the liquid crystal display device employing the pixel dividing method, the gate driver 200 is formed monolithically on a glass substrate. The gate driver 200 has a shift register (the first shift register 20A) having a configuration in which the stage configuration circuits 21A1 to 21An corresponding to the n pieces of the first gate bus lines GLA1 to GLAn connected to the one sub-pixel portion (the first sub-pixel portion PixA) are connected in series, and a shift register (the second shift register 20B) having a configuration in which the stage configuration circuits 21B1 to 21Bn corresponding to the n pieces of second gate bus lines GLB1 to GLBn connected to the other sub-pixel portion (the second sub-pixel portion PixB) are connected in series. In such a configuration, the first shift registers 20A and the second shift register 20B operate on the basis of clock signals whose phases are deviated from each other by 90 degrees. The output signals QA1 to QAn from the first shift register 20A sequentially become the high level every one horizontal scanning period, and the output signals QB1 to QBn from the second shift register 20B sequentially become the high level every one horizontal scanning period. To the first gate bus lines GLA1 to GLAn, the output signals QA1 to QAn from the first shift register 20A are supplied as they are as the scanning signals GA1 to GAn. On the other hand, to the second gate bus lines GLB1 to GLBn, signals expressing AND between the output signals QA1 to QAn from the first shift register 20A and the output signals QB1 to QBn from the second shift register 20B are supplied as the scanning signals GB1 to GBn. Consequently, in each of lines, after lapse of the half of the 1-horizontal scanning period since charging to the pixel capacitance has been started in the first sub-pixel portion PixA, charging to the pixel capacitance in the second sub-pixel portion PixB is started. Moreover, in the first sub-pixel portion PixA and the second sub-pixel portion PixB, charging to the pixel capacitance is finished at the same timing. Therefore, the length of the charging period in the second sub-pixel portion PixB becomes the half of the length of the charging period in the first sub-pixel portion PixA. As described above, in the liquid crystal display device having the configuration in which the gate driver 200 is monolithically formed, the charging potential in the first sub-pixel portion PixA and that in the second sub-pixel portion PixB can be made different from each other. Thus, the liquid crystal display device employing the pixel dividing method can be realized without having a gate driver IC chip.

With reference to FIG. 12, the effect of reduction in IC chips in the embodiment will be described. It should be noted that, in FIG. 12, p denotes the number of gate driver IC chips provided for a general liquid crystal display device (a liquid crystal display device which does not employ the pixel dividing method), and q denotes the number of source driver IC chips provided for a general liquid crystal display device. In a conventional liquid crystal display device having the 2G-1D configuration, to drive twice the number of gate bus lines compared with that in a general liquid crystal display device, 2p pieces of gate driver IC chips are provided. In a conventional liquid crystal display device having the 1G-2D configuration, to drive twice the number of source bus lines compared with that in a general liquid crystal display device, 2q pieces of source driver IC chips are provided. In contrast to those, in the embodiment, the gate driver is monolithically formed, so that the gate drier IC chip is not provided. Moreover, as compared with the conventional liquid crystal display device having the 1G-2D configuration, the number of source driver IC chips is the half. As described above, as compared with the conventional liquid crystal display device employing the pixel dividing method, the number of IC chips for driving a panel can be reduced. Thus, the cost of the liquid crystal display device employing the pixel dividing method can be reduced.

<7. Modifications>

Hereinafter, modifications of the embodiment will be described.

<7.1 First Modification>

Although the stage configuration circuit having the configuration illustrated in FIG. 7 has been described as an example in the foregoing embodiment, the configuration of the stage configuration circuit is not particularly limited. In the following, an example of constructing the stage configuration circuit by thin film transistors having the number smaller than that in the foregoing embodiment will be described as a first modification.

Figure 13:
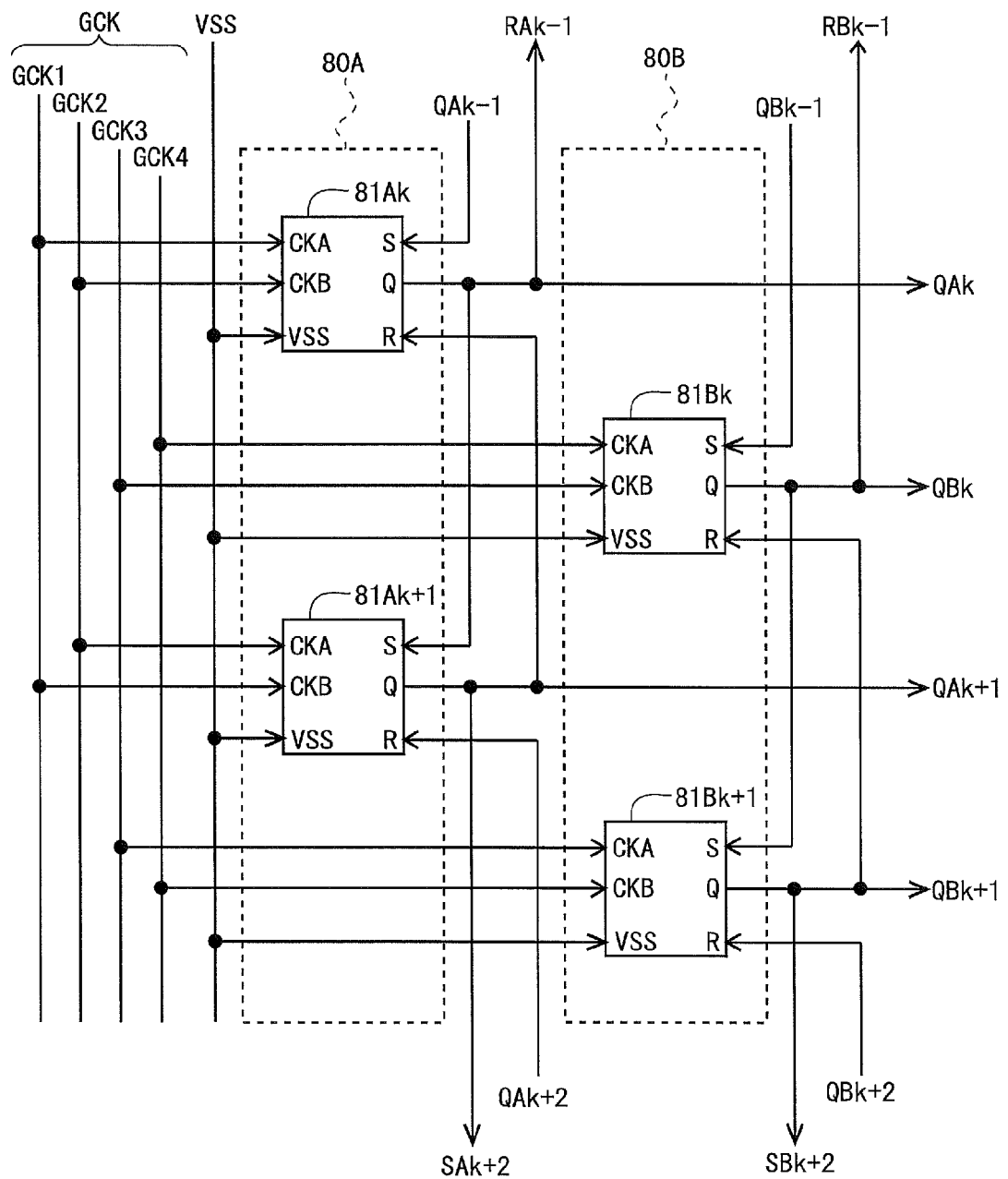
FIG. 13 is a block diagram illustrating the configuration of first and second shift registers in a first modification of the embodiment.

FIG. 13 is a block diagram illustrating the configuration of a first shift register 80A and a second shift register 80B in the modification. In a manner similar to the foregoing embodiment, n pieces of stage configuration circuits are included in each of the shift registers. Different from the foregoing embodiment, each of the stages (each of the stage configuration circuits) in the shift register (the first shift register 80A and the second shift register 80B) is provided with an input terminal for receiving the first clock CKA, an input terminal for receiving the second clock CKB, an input terminal for receiving the DC power supply VSS at the low level, an input terminal for receiving the set signal S, an input terminal for receiving the reset signal R, and an output terminal for outputting the output signal Q. It should be noted that, in FIG. 13, attention is paid to the k-th and (k+1)th stages in each of the shift registers. The gate clock signal GCK (first to fourth gate clock signals GCK1 to GCK4) supplied to the gate driver 200 is similar to that of the foregoing embodiment (refer to FIG. 5).

In the modification, signals supplied to the input terminals in each of the stages (each of the stage configuration circuits) of the first shift register 80A are as follows. As for odd-numbered stages, the first gate clock signal GCK1 is supplied as the first clock CKA, and the second gate clock signal GCK2 is supplied as the second clock CKB. As for even-numbered stages, the second gate clock signal GCK2 is supplied as the first clock CKA, and the first gate clock signal GCK1 is supplied as the second clock CKB. As for any stage, the output signal Q from the preceding stage is supplied as the set signal S, and the output signal Q from the following stage is supplied as the reset signal R. It should be noted that the DC power supply potential VSS at the low level is commonly supplied to all stage configuration circuits. From each of the stages (each of the stage configuration circuits) in the first shift register 80A, the output signal Q is output. In the configuration as described above, in a manner similar to the foregoing embodiment, the output signals QA1 to QAn from the first shift register 80A sequentially become the high level every predetermined period.

The configuration of the second shift register 80B is similar to that of the first shift register 80A. However, as for the odd-numbered stages, the fourth gate clock signal GCK4 is supplied as the first clock CKA, and the third gate clock signal GCK3 is supplied as the second clock CKB. As for the even-numbered stages, the third gate clock signal GCK3 is supplied as the first clock CKA, and the fourth gate clock signal GCK4 is supplied as the second clock CKB. The output signals QB1 to QBn from the second shift register 20B also sequentially become the high level every predetermined period.

Figure 14:
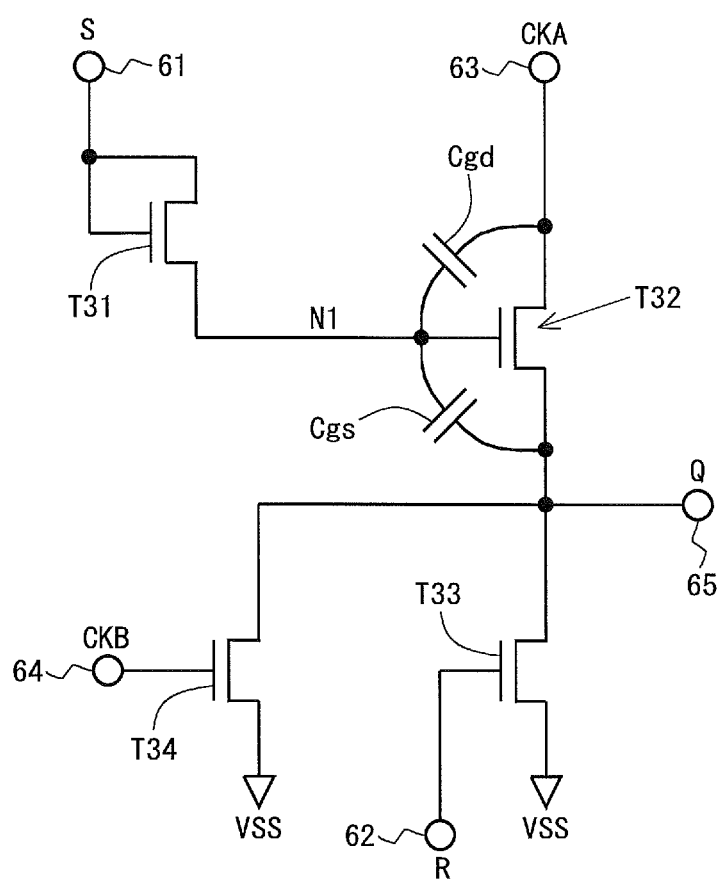
FIG. 14 is a circuit diagram illustrating the configuration of a stage configuration circuit (the configuration of one stage in a shift register) in the first modification of the embodiment.

FIG. 14 is a circuit diagram illustrating the configuration of a stage configuration circuit in the modification. The stage configuration circuit has four thin film transistors T31 to T34. All of the thin film transistors T31 to T34 are of the N channel type. Moreover, the stage configuration circuit has an input terminal for the low-level DC power supply potential VSS and, in addition, four input terminals 61 to 64 and one output terminal 65. Reference numeral 61 is designated to the input terminal receiving the set signal S, reference numeral 62 is designated to the input terminal receiving the reset signal R, reference numeral 63 is designated to the input terminal receiving the first clock CKA, and reference numeral 64 is designated to the input terminal receiving the second clock CKB. Reference numeral 65 is designated to the output terminal for the output signal Q. It should be noted that the phase of the first clock CKA and that of the second clock CKB are deviated from each other by 180 degrees.

As for the thin film transistor T31, the gate terminal and the drain terminal are connected to the input terminal 61 (that is, diode-connected), and the source terminal is connected to the first node Ni. As for the thin film transistor T32, the gate terminal is connected to the first node N1, the drain terminal is connected to the input terminal 63, and the source terminal is connected to the output terminal 65. As for the thin film transistor T33, the gate terminal is connected to the input terminal 62, the drain terminal is connected to the output terminal 65, and the DC power supply potential VSS is applied to the source terminal. As for the thin film transistor T34, the gate terminal is connected to the input terminal 64, the drain terminal is connected to the output terminal 65, and the DC power supply potential VSS is applied to the source terminal.

The function in the stage configuration circuit of each of configuration elements will now be described. The thin film transistor T31 changes the potential of the first node N1 toward the high level when the set signal S is at the high level. The thin film transistor T32 supplies the potential of the first clock CKA to the output terminal 65 when the potential of the first node N1 is at the high level. The thin film transistor T33 changes the potential of the output terminal 65 toward the DC power supply potential VSS when the reset signal R is at the high level. The thin film transistor T34 changes the potential of the output terminal 65 toward the DC power supply potential VSS when the second clock CKB is at the high level. It should be noted that, in the modification, an output control switching element is realized by the thin film transistor T32, a first node turning on switching element is realized by the thin film transistor T31, and an output node turning off switching element is realized by the thin film transistor T33.

Figure 15:
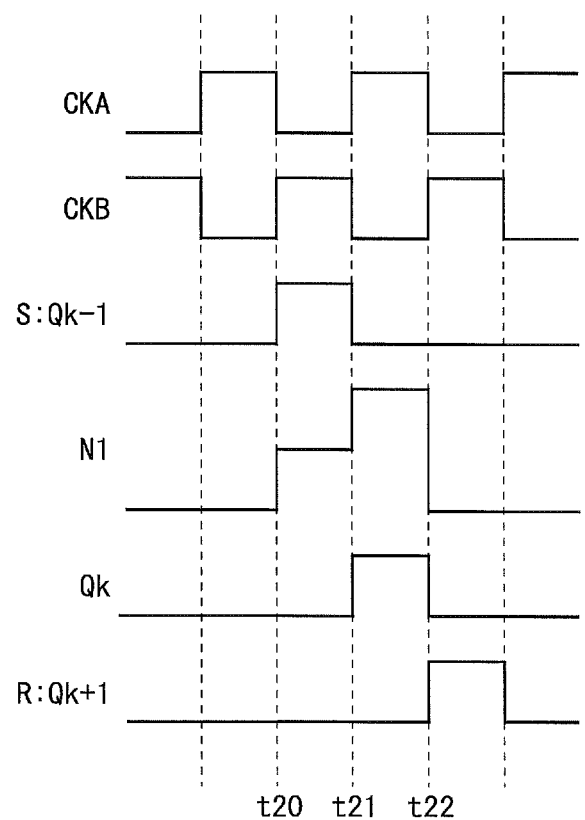
FIG. 15 is a signal waveform chart for explaining the operation of the stage configuration circuit in the first modification of the embodiment.

Hereinafter, with reference to FIGS. 14 and 15, the operation of the stage configuration circuit in the modification will be described. It should be noted that attention is paid to a stage configuration circuit in the k-th stage in each of the shift registers and it is assumed that the output signal Qk is set to the high level during the period from time point t21 to time point t22. As illustrated in FIG. 15, in a period before time point t20, the potential of the first node N1 and the potential of the output signal Q (output terminal 65) are at the low level. The first clock CKA which becomes the high level every predetermined period is supplied to the input terminal 63, and the second clock CKB which becomes the high level every predetermined period is supplied to the input terminal 64 (refer to FIG. 15).

At the time point t20, the pulse of the set signal S is supplied to the input terminal 61. Since the thin film transistor T31 is diode-connected as illustrated in FIG. 14, the thin film transistor T31 becomes the on state by the pulse of the set signal S. Consequently, the potential of the first node N1 changes from the low level to the high level, and the thin film transistor T32 becomes the on state. During the period from the time point t20 to the time point t21, the first clock CKA is at the low level. Consequently, the output signal Qk is maintained at the low level during this period.

At the time point t21, the first clock CKA changes from the low level to the high level. At this time, since the thin film transistor T32 in the on state, the potential of the output terminal 65 rises as the potential of the input terminal 63 rises. As illustrated in FIG. 14, a parasitic capacitance Cgd is formed between the gate and drain of the thin film transistor T32, and a parasitic capacitance Cgs is formed between the gate and source of the thin film transistor T32. Consequently, by the bootstrap effect, the potential of the first node N1 largely rises. As a result, a large voltage is applied to the thin film transistor T32, and the potential of the output signal Qk rises to the potential of the high level of the first clock CKA. It should be noted that, during the period from the time point t21 to the time point t22, the reset signal R and the second clock CKB are at the low level. Due to this, the thin film transistors T33 and T34 are maintained in the off state, so that the potential of the output signal Qk does not decrease in this period.

At the time point t22, the first clock CKA changes from the high level to the low level. Accordingly, the potential of the output terminal 65 decreases as the potential of the input terminal 63 decreases and, further, the potential of the first node N1 decreases via the parasitic capacitances Cgd and Cgs. Moreover, at the time point t22, the pulse of the reset signal R is supplied to the input terminal 62. It makes the thin film transistor T33 become the on state. As a result, the potential of the output terminal 65, that is, the potential of the output signal Qk decreases to the low level.

As described above, also in the case where each of the stages (stage configuration circuits) in the shift registers is constructed as in FIG. 14, the gate driver can be operated in a manner similar to the foregoing embodiment. In the modification, each of the stages constructing the first shift register 80A and the second shift register 80B is provided with thin film transistors having the number smaller than that in the foregoing embodiment. Consequently, the cost of the liquid crystal display device employing the pixel dividing method can be reduced more effectively. It should be noted that, in the case where the potential of the output terminal 65 (the potential of the output signal Qk) is maintained reliably at the low level in a period other than the period from the time point t21 to the time point t22 in FIG. 15 such as the case where, for example, current leak in the thin film transistor T32 is small, a configuration obtained by eliminating the thin film transistor T34 from the configuration illustrated in FIG. 14 may be employed. Consequently, the first shift register 80A and the second shift register 80B are provided with the thin film transistors of the minimum number required, so that the cost can be reduced more effectively.

<7.2 Second Modification>

Although the thin film transistors of only the N-channel type are used in the AND operation circuit in the foregoing embodiment, the present invention is not limited to the configuration. Hereinafter, an example of constructing an AND operation circuit by CMOS using both the N-channel type and the P-channel type will be described as a second modification.

Figure 16:
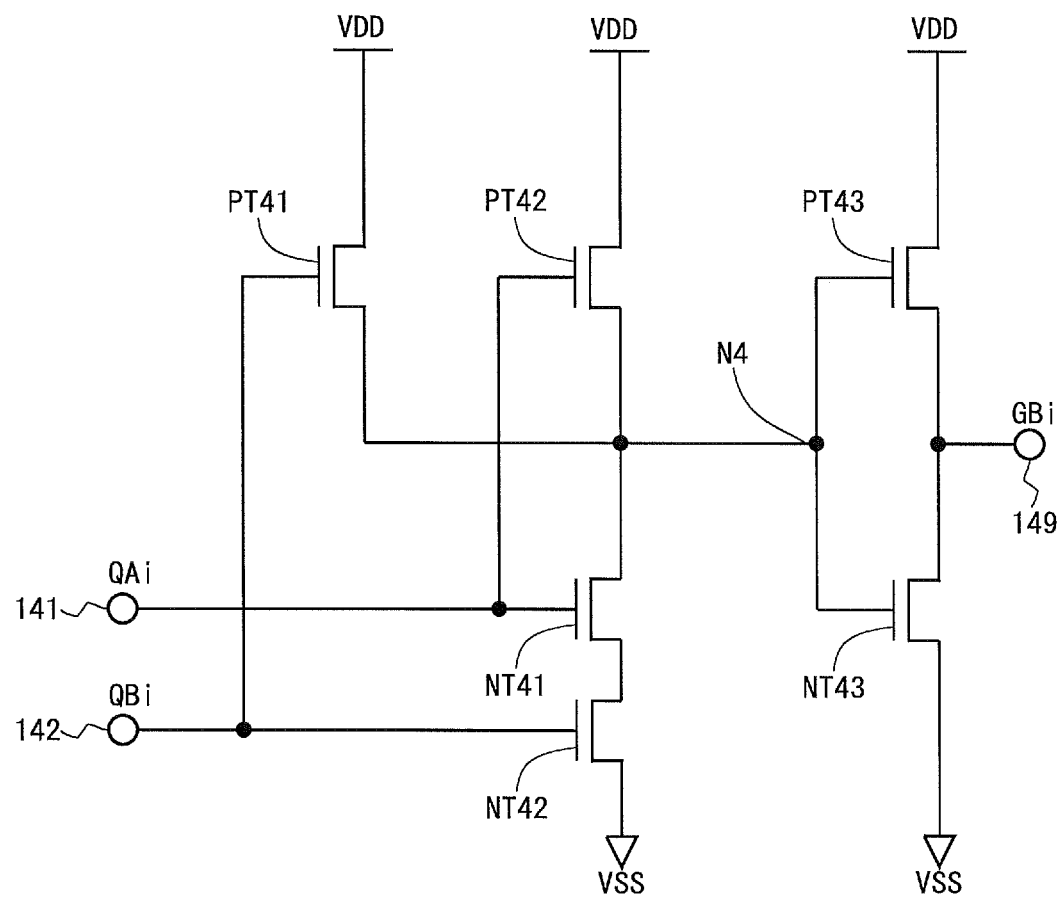
FIG. 16 is a circuit diagram illustrating the configuration of an AND operation circuit in a second modification of the embodiment.
Figure 17:
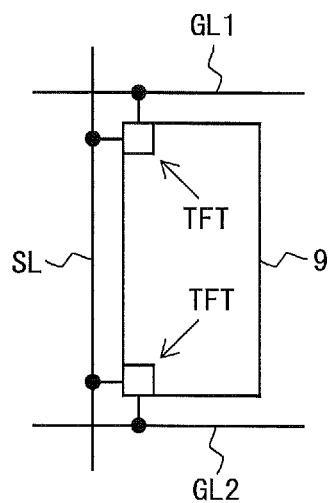
FIG. 17 is a schematic diagram illustrating a 2G-1D configuration.
Figure 18:
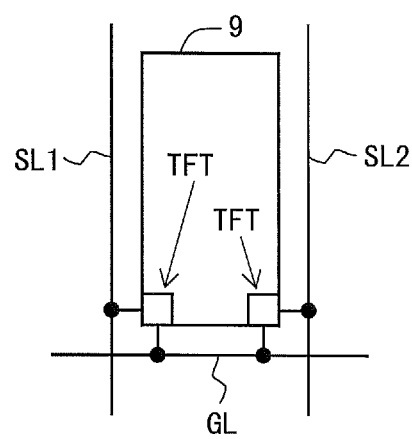
FIG. 18 is a schematic diagram illustrating a 1G-2D configuration.

FIG. 16 is a circuit diagram illustrating the configuration of an AND operation circuit in a second modification of the embodiment. The AND operation circuit has six thin film transistors NT41 to NT43 and PT41 to PT43, two input terminals 141 and 142, and an output terminal 149. The thin film transistors NT41 to NT43 are of the N-channel type, and the thin film transistors PT41 to PT43 are of the P-channel type. In the configuration illustrated in FIG. 16, an inverter using a node N4 as an input terminal is formed by the thin film transistor PT43 and thin film transistor NT43. As for the thin film transistor PT41, the gate terminal is connected to the input terminal 142, the DC power supply potential VDD is supplied to the drain terminal, and the source terminal is connected to the node N4. As for thin film transistor PT42, the gate terminal is connected to the input terminal 141, the DC power supply potential VDD is supplied to the drain terminal, and the source terminal is connected to the node N4. As for the thin film transistor NT41, the gate terminal is connected to the input terminal 141, the drain terminal is connected to the node N4, and the source terminal is connected to the drain terminal of the thin film transistor NT42. As for the thin film transistor NT42, the gate terminal is connected to the input terminal 142, the drain terminal is connected to the source terminal of the thin film transistor NT41, and the DC power supply potential VSS is supplied to the source terminal.

In the configuration as described above, the output signal QAi from the first shift register 80A is supplied to the input terminal 141, and the output signal QBi from the second shift register 80B is supplied to the input terminal 142. When both of the output signal QAi and the output signal QBi are at the high level, the thin film transistors PT41 and PT42 become the off state and the thin film transistors NT41 and NT42 become the on state, so that the potential of the node N4 becomes the low level. Consequently, the thin film transistor PT43 becomes the on state, and the thin film transistor NT43 becomes the off state. As a result, the scanning signal GBi output from the output terminal 149 becomes the high level. On the other hand, when at least one of the output signal QAi and the output signal QBi is at the low level, at least one of the thin film transistor PT41 and the thin film transistor PT42 becomes the on state, and at least one of the thin film transistor NT41 and the thin film transistor NT42 becomes the off state, so that the potential of the node N4 becomes the high level. Consequently, the thin film transistor PT43 becomes the off state, and the thin film transistor NT43 becomes the on state. As a result, the scanning signal GBi output from the output terminal 149 becomes the low level.

As described above, the circuit configuration using the CMOS can be employed for the AND operation circuit. Consequently, in the liquid crystal display device in which a TFT using polycrystal silicon (p-Si TFT) is employed as a drive element, power consumption can be reduced, for example, by constructing an AND operation circuit with a CMOS.

<7.3 Others>

In the foregoing embodiment, the phase of the fourth gate clock signal GCK4 is delayed from that of the first gate clock signal GCK1 by 90 degrees, and the phase of the third gate clock signal GCK3 is delayed from that of the second gate clock signal GCK2 by 90 degrees. The present invention, however, is not limited to this. The delays of the phases may be in the range of zero degree to 180 degrees. Regarding FIG. 5, for example, the configuration may be such that the phase of the fourth gate clock signal GCK4 is delayed from the phase of the first gate clock signal GCK1 only by 60 degrees and the phase of the third gate clock signal GCK3 is delayed from the phase of the second gate clock signal GCK2 only by 60 degrees. In this case, the relationship between the length of the period T1 in which charging to the pixel capacitance is performed in the first sub-pixel portion PixA and the length of the period T2 in which charging to the pixel capacitance is performed in the second sub-pixel portion PixB is as expressed by the following equation (6).

$$T2=(2/3)\times T1 \qquad (6)$$

As a result, the charging potential in the first sub-pixel portion PixA and the charging potential in the second sub-pixel portion PixB become different values.

In the foregoing embodiment, the scanning signal GBi supplied to the second gate bus line GLBi is generated by the AND operation circuit. The present invention, however, is not limited to this. The scanning signal GBi may be generated by a negative AND operation circuit and an inverter.

Further, the configuration may be such that the output signals QB1 to QBn from the second shift register 20B are supplied as they are as the scanning signals GB1 to GBn to the second gate bus lines GLB1 to GLBn and signals expressing AND between the output signals QA1 to QAn from the first shift register 20A and the output signals QB1 to QBn from the second shift register 20B are supplied to the first gate bus lines GLA1 to GLAn. In this case, different from the foregoing embodiment, the charging period in the second sub-pixel portion PixB becomes longer than the charging period in the first sub-pixel portion PixA.

DESCRIPTION OF REFERENCE CHARACTERS

10: LIQUID CRYSTAL PANEL
20A: FIRST SHIFT REGISTER
20B: SECOND SHIFT REGISTER
21A to 21An, 21B1 to 21Bn: STAGE CONFIGURATION CIRCUITS (STAGES IN SHIFT REGISTER)
100: DISPLAY UNIT
200: GATE DRIVER
300: SOURCE DRIVER
400: DISPLAY CONTROL CIRCUIT
GLAi, GLA1 to GLAn: FIRST GATE BUS LINES
GLBi, GLB1 to GLBn: SECOND GATE BUS LINES
SL1 to SLm: SOURCE BUS LINES
PixA: FIRST SUB-PIXEL PORTION
PixB: SECOND SUB-PIXEL PORTION
GAi, GA1 to GAn: SCANNING SIGNALS APPLIED TO FIRST GATE BUS LINE
GBI, GB1 to GBn: SCANNING SIGNALS APPLIED TO SECOND GATE BUS LINE
GCK1 to GCK4: FIRST TO FOURTH GATE CLOCK SIGNALS
S: SET SIGNAL
R: RESET SIGNAL
Q, Z: OUTPUT SIGNALS FROM STAGE CONFIGURATION CIRCUITS

The invention claimed is:

1. A liquid crystal display device comprising:
a pixel portion which has a first sub-pixel portion including a first switching element, a first pixel electrode connected to a first conduction terminal of the first switching element, and a first pixel capacitance accumulating charges in accordance with potential of the first pixel electrode, and a second sub-pixel portion including a second switching element, a second pixel electrode connected to a first conduction terminal of the second switching element, and a second pixel capacitance accumulating charges in accordance with potential of the second pixel electrode, and forms a pixel matrix of n rows×m columns (n and m are natural numbers) in a display unit for displaying an image;
a first scanning signal line provided in correspondence with each of the rows in the pixel matrix and connected to a control terminal of the first switching element;
a second scanning signal line provided in correspondence with each of the rows of the pixel matrix and connected to a control terminal of the second switching element;
a video signal line provided in correspondence with each of the columns of the pixel matrix and connected to a second conduction terminal of the first switching element and a second conduction terminal of the second switching element;
a scanning signal line drive circuit for driving the first scanning signal line and the second scanning signal line; and
a video signal line drive circuit for driving the video signal line, wherein
the scanning signal line drive circuit includes:
a first shift register constructed by a plurality of first output signal generating stages corresponding to the first scanning signal line and outputting a first output signal sequentially becoming an on level stage by stage from the plurality of first output signal generating stages in accordance with a first clock signal group as two-phase clock signals which are deviated from each other by 180 degrees;
a second shift register constructed by a plurality of second output signal generating stages corresponding to the second scanning signal line and outputting a second output signal sequentially becoming an on level stage by stage from the plurality of second output signal generating stages in accordance with a second clock signal group as two-phase clock signals which are deviated from each other by 180 degrees; and
an AND operation unit performing an AND operation using the first output signal and the second output signal and outputting a third output signal indicative of an operation result,
the display unit and the scanning signal line drive circuit are monolithically formed on a single substrate, and
the first output signal is applied as a scanning signal to the first scanning signal line and the third output signal is applied as a scanning signal to the second scanning signal line, or the third output signal is applied as a scanning signal to the first scanning signal line and the second output signal is applied as a scanning signal to the second scanning signal line.

2. The liquid crystal display device according to claim 1, wherein the AND operation unit is an AND operation circuit for obtaining AND between the first output signal and the second output signal.

3. The liquid crystal display device according to claim 2, wherein when a clock signal which is input to control output of the first output signal out of the two-phase clock signals constructing the first clock signal group upon paying attention to each of the first output signal generating stages and a clock signal which is input to control output of the second output signal out of the two-phase clock signals constructing the second clock signal group upon paying attention to each of the second output signal generating stages are defined as stage output control clocks, in the first output signal generating stage and the second output signal generating stage as a pair of stages corresponding to any row, the phase of the stage output control clock which is input to the second output signal generating stage is delayed from the phase of the stage output control clock which is input to the first output signal generating stage by a range of zero degree to 180 degrees.

4. The liquid crystal display device according to claim 3, wherein in the first output signal generating stage and the second output signal generating stage as the pair of stages corresponding to any row, the phase of the stage output control clock which is input to the second output signal generating stage is delayed from the phase of the stage output control clock which is input to the first output signal generating stage by 90 degrees.

5. The liquid crystal display device according to claim 1, wherein the first output signal generating stage, the second output signal generating stage, and the AND operation unit are constructed by using thin film transistors of either an N-channel type or a P-channel type.

6. The liquid crystal display device according to claim 5, wherein when a clock signal which is input to control output of the first output signal out of the two-phase clock signals constructing the first clock signal group upon paying attention to each of the first output signal generating stages and a clock signal which is input to control output of the second output signal out of the two-phase clock signals constructing the second clock signal group upon paying attention to each of the second output signal generating stages are defined as stage output control clocks, each of the first output signal generating stage and the second output signal generating stage comprises:

an output node;

an output control switching element having a first conduction terminal to which the stage output control clock is supplied and a second conduction terminal connected to the output node;

a first node connected to a control terminal of the output control switching element;

a first node turning on switching element having a second conduction terminal connected to the first node, and a control terminal and a first conduction terminal to which a signal output from the output node of a preceding stage is supplied; and an output node turning off switching element having a first conduction terminal connected to the output node, a second conduction terminal to which a potential of an off level is supplied, and a control terminal to which a signal output from the output node in the following stage is supplied, the first output signal is output from the output node of the first output signal generating stage, and the second output signal is output from the output node of the second output signal generating stage.

* * * * *